US011044431B2

(12) United States Patent
Ota et al.

(10) Patent No.: US 11,044,431 B2
(45) Date of Patent: Jun. 22, 2021

(54) RADIATION IMAGE CAPTURING APPARATUS

(71) Applicant: KONICA MINOLTA, INC., Tokyo (JP)

(72) Inventors: Ikuma Ota, Tokyo (JP); Kazuhiro Sakino, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 200 days.

(21) Appl. No.: 15/919,547

(22) Filed: Mar. 13, 2018

(65) Prior Publication Data

US 2018/0270433 A1 Sep. 20, 2018

(30) Foreign Application Priority Data

Mar. 15, 2017 (JP) .............................. JP2017-050294

(51) Int. Cl.
*H04N 5/378* (2011.01)
*H01L 27/146* (2006.01)
*G01T 1/20* (2006.01)
*G01T 1/24* (2006.01)
(Continued)

(52) U.S. Cl.
CPC ........... *H04N 5/378* (2013.01); *G01T 1/2018* (2013.01); *G01T 1/247* (2013.01); *H01L 27/14609* (2013.01); *H01L 27/14636* (2013.01); *H04N 5/32* (2013.01); *H04N 5/3575* (2013.01)

(58) Field of Classification Search
CPC ........ H04N 5/378; H04N 5/32; H04N 5/3575; G01T 1/2018; G01T 1/247; H01L 27/14609; H01L 27/14636
See application file for complete search history.

(56) References Cited

U.S. PATENT DOCUMENTS

| 6,734,908 B1 * | 5/2004 | Watanabe ............ H04N 5/3575 |
| | | 250/208.1 |
| 2006/0214699 A1 * | 9/2006 | Watanabe ................ H04N 5/30 |
| | | 327/72 |

(Continued)

FOREIGN PATENT DOCUMENTS

| JP | 4449215 B2 | 4/2010 |
| JP | 2013176563 A | 9/2013 |

*Primary Examiner* — Antoinette T Spinks
(74) *Attorney, Agent, or Firm* — Cantor Colburn LLP

(57) ABSTRACT

A radiation image capturing apparatus includes: scanning lines and signal lines; radiation detection elements; a scan driver switching a switching element of the radiation detection elements between on and off; and a readout IC incorporating readout circuits reading, as image data, electric charges from each radiation detection element, the readout circuit including: an integrating circuit outputting a voltage value corresponding to the electric charges; a reset switch resetting the integrating circuit; a first sample-and-hold circuit holding, as a reference value, the voltage value before the electric charges flow; a second sample-and-hold circuit holding, as a signal value, the voltage value after the electric charges flow; and a difference circuit outputting difference between the signal value and the reference value, the radiation image capturing apparatus further including a mechanism changing the voltage value from completion of the resetting and turning off of the reset switch until holding of the reference value.

2 Claims, 17 Drawing Sheets

(51) Int. Cl.
*H04N 5/32* (2006.01)
*H04N 5/357* (2011.01)

(56) References Cited

U.S. PATENT DOCUMENTS

| | | | |
|---|---|---|---|
| 2013/0032696 A1* | 2/2013 | Tajima | A61B 6/42 250/208.1 |
| 2014/0239189 A1* | 8/2014 | Sakino | H04N 5/32 250/394 |
| 2018/0115723 A1* | 4/2018 | Takayanagi | H01L 27/14609 |

* cited by examiner

RADIATION IMAGE CAPTURING APPARATUS

CROSS-REFERENCE TO RELATED APPLICATIONS

The present application claims priority under 35 U.S.C. § 119 to Japanese Patent Application No. 2017-050294, filed on Mar. 15, 2017, the entire disclosure of which are incorporated herein by reference.

BACKGROUND

Technological Field

The present invention relates to a radiation image capturing apparatus, and particularly to a radiation image capturing apparatus capable of capturing a moving image.

Description of the Related Art

There have been developed various radiation image capturing apparatuses, such as a so-called direct type radiation image capturing apparatus that generates electric charges with detection elements according to doses of emitted radiation and converts the electric charges into electric signals, and a so-called indirect type radiation image capturing apparatus that converts emitted radiation into electromagnetic waves of other wavelength such as visible light or the like by a scintillator or the like, thereafter generates electric charges with photoelectric conversion elements such as photodiodes according to energy of the electromagnetic waves that are converted and emitted, and converts the electric charges into electric signals (that is, image data). Note that, in the present invention, the detection elements in the direct type radiation image capturing apparatus and the photoelectric conversion elements in the indirect type radiation image capturing apparatus are collectively referred to as radiation detection elements.

These types of radiation image capturing apparatuses are known as flat panel detectors (FPDs). The FPD has been conventionally configured as a so-called exclusive machine type (also referred to as a fixed type or the like) integrally formed with a support base and the like. In recent years, a portable type (also referred to as a cassette type or the like) radiation image capturing apparatus which is made portable by housing the radiation detection elements and the like in a housing has been developed and utilized.

Further, for each capturing, the radiation image capturing apparatus can store read image data in a storage such as a random access memory (RAM) and transmit the read image data to an external device in a wireless manner or a wired manner. In recent years, therefore, the radiation image capturing apparatus has been used for still image capturing. Development of technology for using the radiation image capturing apparatus for moving image capturing is also in progress.

Incidentally, in a case where the radiation image capturing apparatus is used for the moving image capturing, as a capturing operation is continuously performed a plurality of times, a circuit in the apparatus generates heat, and a temperature of the circuit rises. This may cause a phenomenon (so-called temperature drift) in which an offset value of image data read for each frame is temporally shifted (that is, shifted as time elapses from a start of capturing). There are various factors that can cause such temperature drift. For example, one of the factors is that a temperature of a readout IC (see a reference numeral 16 in FIGS. 3 and 4 to be described later) that performs readout processing of the image data in the radiation image capturing apparatus changes during the moving image capturing (see, for example, Japanese Patent No. 4449215).

As a method for preventing occurrence of such temperature drift due to the readout IC, for example, the readout IC is energized and warmed up before the start of the moving image capturing such that the temperature of the readout IC is raised beforehand and stabilized. Further, J P 2013-176563 A describes a radiation image capturing apparatus and the like including a cooling mechanism that cools the apparatus, in which control is performed to increase or decrease a frame rate of moving image capturing according to contact or noncontact between a radiation detection sensor and the cooling mechanism.

However, when the readout IC is warmed up before the start of the moving image capturing in order to prevent the temperature drift due to a temperature change and the like of the readout IC as described above, a photographer such as a radiologist has to wait until the warm-up of the radiation image capturing apparatus is completed even in a case where the photographer wishes to immediately start the moving image capturing, and there is a possibility that the moving image capturing cannot be started at a timing intended by the photographer. Further, when the readout IC is energized before the capturing as described above, there is a possibility that power consumption in the radiation image capturing apparatus is unnecessarily increased.

In a case where the moving image is captured with the radiation image capturing apparatus, it is rather required that the moving image capturing can be immediately started without requiring warm-up or the like before the capturing. In addition, it is required that a frame rate can be increased by performance of readout processing on the image data for each frame as fast as possible (that is, in a short time) (hereinafter referred to as high-speed readout).

Further, in a case where a cooling mechanism is provided as in JP 2013-176563 A, particularly when the cooling mechanism is provided in a portable type radiation image capturing apparatus, for example, the radiation image capturing apparatus becomes thick in a thickness direction (an irradiation direction of radiation), which may cause problems that the portable type radiation image capturing apparatus becomes unable to be loaded in a cassette holder of an image capturing base, weight of the apparatus becomes heavy, and the like.

SUMMARY

The present invention has been made in view of the above points, and an object thereof is to provide a radiation image capturing apparatus capable of capturing a moving image, in which the moving image capturing can be immediately started without incurring increases in weight and power consumption, and both high-speed readout of image data and suppression and reduction of temperature drift can be realized.

To achieve the abovementioned object, according to an aspect of the present invention, a radiation image capturing apparatus reflecting one aspect of the present invention comprises:

a plurality of scanning lines and a plurality of signal lines;

a plurality of radiation detection elements arranged two-dimensionally;

a scan driver capable of switching a switching element of the radiation detection elements between on and off by applying an on-voltage or an off-voltage to the switching element via the scanning lines; and a readout IC incorporating a plurality of readout circuits that reads out, as image data, electric charges flowing in from each of the radiation detection elements via each of the signal lines, wherein the readout circuit includes:

an integrating circuit that outputs a voltage value corresponding to the electric charges flowing in from each of the radiation detection elements;

a reset switch that resets the integrating circuit;

a first sample-and-hold circuit that holds, as a reference value, the voltage value output from the integrating circuit before the electric charges flow in from each of the radiation detection elements;

a second sample-and-hold circuit that holds, as a signal value, the voltage value output from the integrating circuit after the electric charges flow in from each of the radiation detection elements; and a difference circuit that outputs difference between the signal value held by the second sample-and-hold circuit and the reference value held by the first sample-and-hold circuit, and the radiation image capturing apparatus further includes a mechanism that changes the voltage value output from the integrating circuit during a period from when the resetting of the integrating circuit is completed and the reset switch of the readout circuit is turned off until when the first sample-and-hold circuit holds the reference value.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention:

FIG. 6 is a diagram illustrating on/off timings of a reset switch, a first and second switches, and a TFT in the configuration example of FIG. 5, changes in a voltage value, a reference value, and a signal value output from an integrating circuit, and the like;

FIG. 7 is a diagram illustrating feed throughs generated between a scanning line and a signal line via the TFT, and the like;

FIG. 8 is a diagram illustrating the on/off timings of the reset switch and the like in the configuration example of FIG. 5, changes in the voltage value, the reference value, and the signal value output from the integrating circuit in a case where a temperature of a readout IC is low and a case where the temperature is high, and the like;

FIG. 12 is a diagram illustrating on/off timings of a reset switch, a capacity, and the like in Configuration Example 1 of FIG. 10, changes in a voltage value, a reference value, and a signal value output from an integrating circuit in a case where a temperature of a readout IC is low and a case where the temperature is high, and the like;

FIG. 15 is a diagram illustrating on/off timings of a reset switch, a TFT, and the like in Configuration Example 3, changes in a voltage value, a reference value, and a signal value output from an integrating circuit in a case where a temperature of a readout IC is low and a case where the temperature is high, and the like;

FIG. 17 is a diagram illustrating on/off timings of each reset switch and the like in Configuration Example 4 of FIG. 16, changes in a voltage value, a reference value, and a signal value output from an integrating circuit in a case where a temperature of a readout IC is low and a case where the temperature is high, and the like.

DETAILED DESCRIPTION OF EMBODIMENTS

Hereinafter, one or more embodiments of a radiation image capturing apparatus according to the present invention will be described with reference to the drawings. However, the scope of the invention is not limited to the disclosed embodiments.

Note that, hereinafter, a so-called indirect type radiation image capturing apparatus that includes a scintillator and the like and converts emitted radiation into light of other wavelength such as visible light to obtain electric signals will be described as the radiation image capturing apparatus. However, the present invention can also be applied to a so-called direct type radiation image capturing apparatus that directly detects radiation by radiation detection elements without using the scintillator and the like. Further, a case where the radiation image capturing apparatus is a so-called portable type will be described, but the present invention can also be applied to an exclusive machine type radiation image capturing apparatus.

[Configuration and the Like of Radiation Image Capturing Apparatus]

Figure 1:
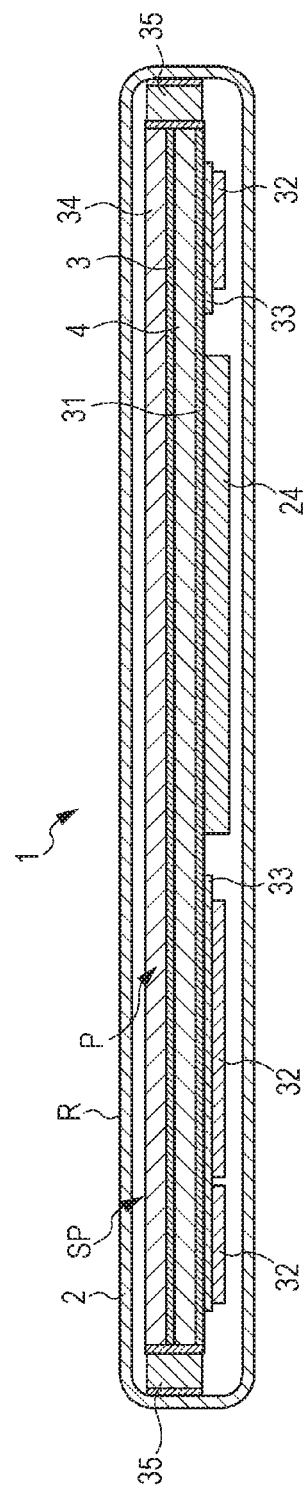
FIG. 1 is a cross-sectional view of a radiation image capturing apparatus according to an embodiment of the present invention.
Figure 2:
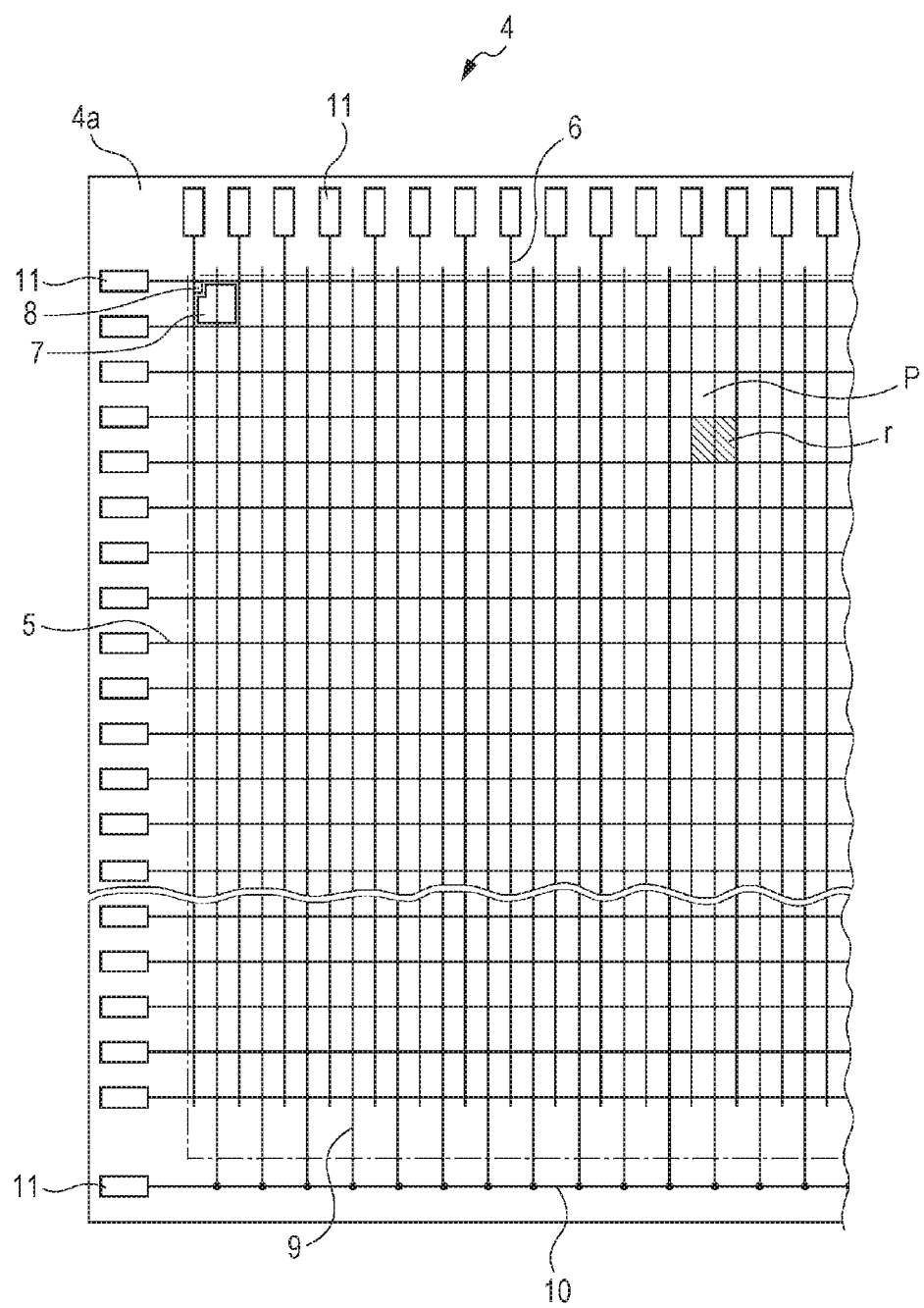
FIG. 2 is a plan view illustrating a configuration of a substrate of the radiation image capturing apparatus according to an embodiment of the present invention.

A configuration and the like of the radiation image capturing apparatus according to the present embodiment will be described. FIG. 1 is a cross-sectional view of the radiation image capturing apparatus according to the present embodiment, and FIG. 2 is a plan view illustrating a configuration of a substrate of the radiation image capturing apparatus. Note that in FIGS. 1 and 2 and each of the following drawings, a relative size, arrangement, and the like of each member in an actual apparatus are not necessarily accurately represented.

In the present embodiment, as illustrated in FIG. 1, a radiation image capturing apparatus 1 includes a housing 2 that has a radiation incident surface R which is a surface to be irradiated with radiation, and houses a sensor panel SP including a scintillator 3, a sensor substrate 4, and the like. Further, although not illustrated in FIG. 1, in the present embodiment, the housing 2 is provided with an antenna 41 used for transmitting data such as image data D or transmitting/receiving a signal in a wireless manner (see FIG. 3 to be described later).

Further, although not illustrated in FIG. 1, in the present embodiment, the radiation image capturing apparatus 1 is provided with a connector on a side surface or the like of the housing 2, such that the data such as the image data D can be transmitted or the signal can be transmitted/received in a wired manner via the connector.

As illustrated in FIG. 1, a base 31 is disposed inside the housing 2, and the sensor substrate 4 is disposed on an upper surface side of the base 31 via a lead thin plate or the like (not illustrated). Radiation detection elements 7 and the like are provided on an upper surface of the sensor substrate 4, which will be described later. Further, the scintillator 3 and a scintillator substrate 34 are disposed above the sensor substrate 4 in a state where the scintillator 3 formed on the scintillator substrate 34 and the radiation detection elements 7 and the like on the sensor substrate 4 face each other.

A PCB board 33 on which an electronic component 32 and the like are disposed, a built-in power source 24, and the like are attached to a lower surface side of the base 31. In the present embodiment, the sensor panel SP is formed in this manner. Further, in the present embodiment, a cushioning material 35 is provided between the sensor panel SP and the side surface of the housing 2 to prevent the sensor panel SP and the housing 2 from colliding with each other.

As illustrated in FIG. 2, a plurality of scanning lines 5 and a plurality of signal lines 6 are disposed so as to cross each other on an upper surface (that is, a surface facing the scintillator 3) 4a of the sensor substrate 4. Further, in regions r partitioned by the plurality of scanning lines 5 and the plurality of signal lines 6, the radiation detection elements 7 are provided. In the present embodiment, each radiation detection element 7 is arranged in a two-dimensional (matrix) manner in this way.

Further, in the present embodiment, a plurality of bias lines 9 are disposed in parallel to the signal lines 6, and each bias line 9 is connected to wire connection 10. A plurality of input/output terminals 11 is provided on a periphery of the sensor substrate 4, and the input/output terminals 11 include input/output terminals connected to the scanning lines 5, input/output terminals connected to the signal lines 6, and an input/output terminal connected to the wire connection 10.

Figure 3:
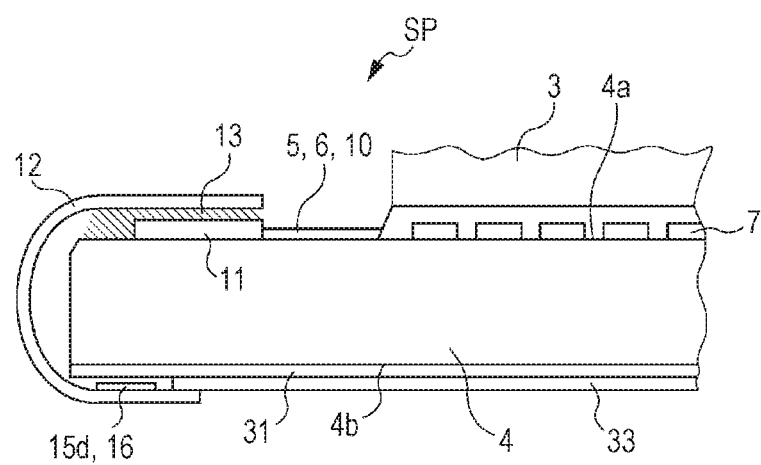
FIG. 3 is a side view illustrating a substrate to which a flexible circuit board, a PCB board, and the like are attached.

In the present embodiment, as illustrated in FIG. 3, a flexible circuit board 12 in which chips such as a readout IC 16 and a gate IC 15d constituting a gate driver 15b of a scan driver 15 to be described later are incorporated on a film is connected to each input/output terminal 11 via an anisotropic conductive adhesive material 13 such as anisotropic conductive adhesive film (anisotropic conductive film) or an anisotropic conductive paste.

In addition, the flexible circuit board 12 is drawn around to a back surface 4b side of the sensor substrate 4, and is connected to the above-mentioned PCB board 33 on the back surface 4b side. In this manner, the sensor panel SP of the radiation image capturing apparatus 1 is formed. Note that, in FIG. 3, illustration of the electronic component 32 and the like is omitted.

Figure 4:
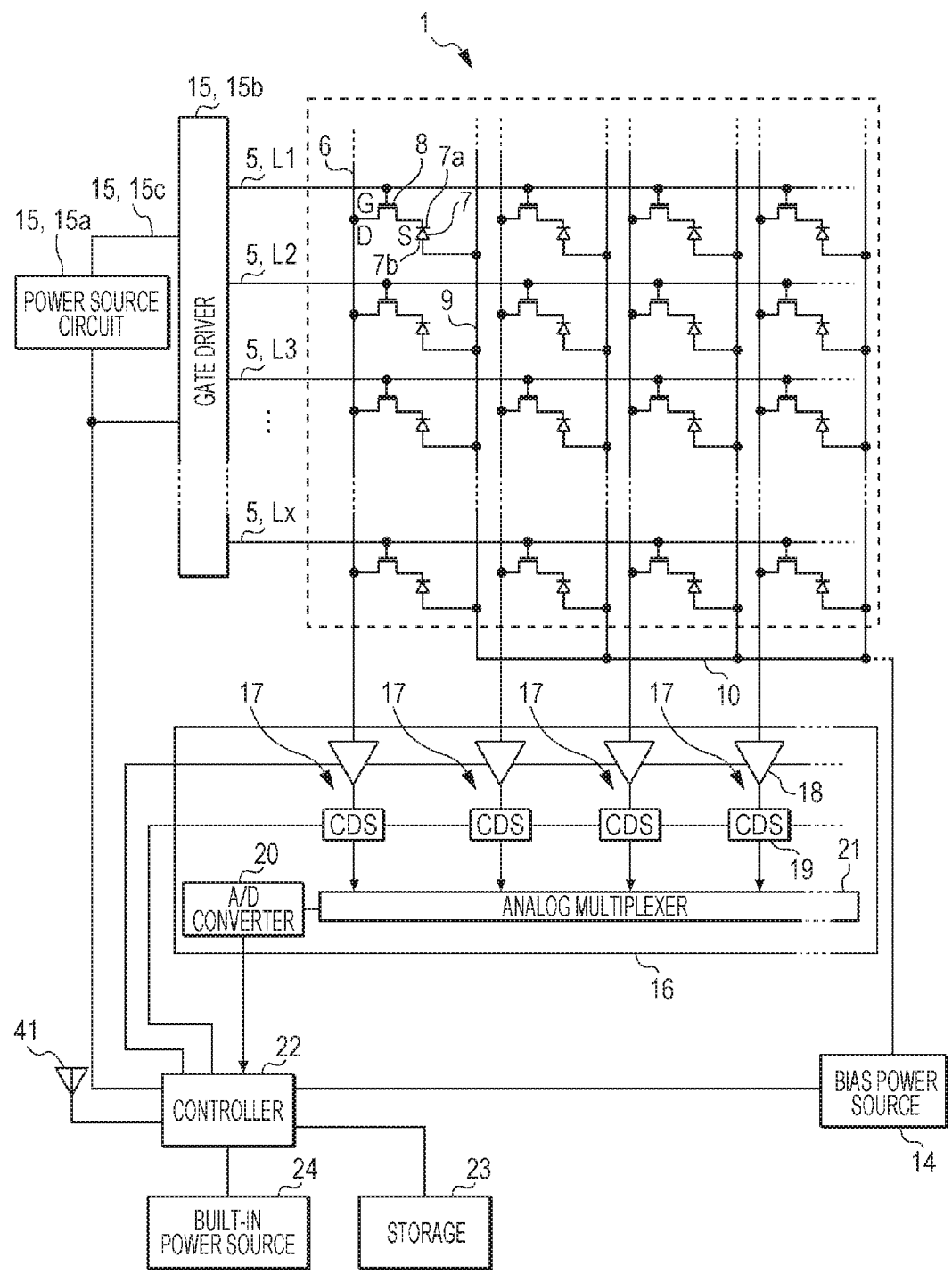
FIG. 4 is a block diagram illustrating an equivalent circuit of the radiation image capturing apparatus according to an embodiment of the present invention.

Next, a circuit configuration of the radiation image capturing apparatus 1 will be described. FIG. 4 is a block diagram illustrating an equivalent circuit of the radiation image capturing apparatus 1 according to the present embodiment. Electric charges corresponding to dose of radiation emitted through a subject which is not illustrated (or a light amount of an electromagnetic wave converted by the scintillator 3) are generated in each radiation detection element 7. Although the radiation detection element 7 includes a photodiode in the present embodiment, it is also possible to use a phototransistor or the like for the radiation detection element 7, for example.

The bias line 9 is connected to one electrode 7b of each radiation detection element 7, and reverse bias voltage Vb is applied from a bias power source 14 to each radiation detection element 7 via the bias line 9 and the wire connection 10. Further, a drain terminal D of a thin film transistor (hereinafter referred to as TFT) 8 is connected as a switching element to the other electrode 7a of each radiation detection element 7, and a source terminal S of the TFT 8 is connected to the signal line 6.

Further, the TFT 8 is turned on when on-voltage is applied to a gate terminal G from the scan driver 15 to be described later via the scanning lines 5, and releases the electric charges accumulated in the radiation detection element 7 to the signal line 6. Further, the TFT 8 is turned off when off-voltage is applied through the scanning line 5, stops release of the electric charges from the radiation detection element 7 to the signal lines 6 such that the electric charges are accumulated in the radiation detection element 7. Each signal line 6 is connected to each readout circuit 17 built in the readout IC 16. Note that a plurality of readout ICs 16 is provided.

On the other hand, each scanning line 5 is connected to the gate driver 15b of the scan driver 15. In the scan driver 15, the on-voltage and the off-voltage are supplied from a power source circuit 15a to the gate driver 15b via wiring 15c, and the gate driver 15b switches voltage to be applied to each of lines L1 to Lx of the scanning lines 5 between the on-voltage and the off-voltage. Further, the gate driver 15b can switch the state of the TFT 8 between on and off by application of the on-voltage or the off-voltage via the scanning lines 5 to the gate terminal G of the TFT 8 serving as the switching element of the radiation detection element 7.

In readout processing on the image data D from each radiation detection element 7, when each TFT 8 connected to the scanning line 5 to which the on-voltage is applied from the gate driver 15b is turned on, the electric charges are released from the radiation detection element 7 to the signal line 6 via the TFT 8 and flow into the readout circuit 17. In an integrating circuit 18 of the readout circuit 17, a voltage value Vout according to an inflow amount of the electric charges is output.

Further, a correlated double sampling circuit (described as "CDS" in FIG. 4) 19 samples and holds the voltage value Vout output from the integrating circuit 18, and reads out and outputs the voltage value Vout as image data D of an analog value to a downstream side. Note that a configuration and the like of the readout circuit 17 according to the present embodiment will be described later in detail.

Then, the image data D output from the correlated double sampling circuit 19 is sequentially transmitted to an A/D converter 20 via an analog multiplexer 21, sequentially converted into image data D of a digital value by the A/D converter 20, and sequentially stored in a storage 23. The image data D is then read out from each radiation detection element 7 by sequentially applying the on-voltage to each of the lines L1 to Lx of the scanning lines 5 from the gate driver 15b and sequentially switching the radiation detection element 7 that reads out the image data D.

A controller 22 includes a computer in which a central processing unit (CPU), a read only memory (ROM), a random access memory (RAM), an input/output interface, and the like which are not illustrated are connected to a bus, a field programmable gate array (FPGA), and the like. The controller 22 may also include a dedicated control circuit. Further, the controller 22 is connected to a storage 23 including a static RAM (SRAM), a synchronous DRAM (SDRAM), a NAND type flash memory, and the like, the built-in power source 24 such as a lithium ion capacitor, the above-mentioned antenna 41, and the like.

[Configuration and the Like of Readout Circuit According to Present Embodiment]

Next, the configuration and the like of the readout circuit 17 according to the present embodiment will be described. First, a conventional configuration example of the readout circuit 17 including the integrating circuit 18 and the correlated double sampling circuit 19 will be described with reference to FIG. 5.

The readout circuit 17 includes the integrating circuit 18, and when the TFT 8 serving as the switching element is turned on at the time of the readout processing on the image data D, and the electric charges flow from the radiation detection element 7, the integrating circuit 18 outputs the voltage value Vout corresponding to the electric charges. The integrating circuit 18 is configured as a charge amplifier circuit in which a capacitor 18b and a reset switch 18c are connected in parallel between an inverting input terminal and an output terminal of an operational amplifier 18a that outputs the voltage value Vout.

When the reset switch 18c is turned on, the electric charges accumulated in the capacitor 18b are released and the integrating circuit 18 is reset. Note that the signal line 6 is connected to the inverting input terminal of the operational amplifier 18a, and a reference voltage $V_0$ is applied to a non-inverting input terminal of the operational amplifier 18a. Note that, for this reason, voltage of the signal line 6 is the reference voltage $V_0$. GND potential may be applied as the reference voltage $V_0$.

Further, the readout circuit 17 includes the correlated double sampling circuit 19 including a resistor R, a first sample-and-hold circuit SHR, a second sample-and-hold circuit SHS, and a difference circuit 19a. The resistor R is connected in series to the output terminal of the operational amplifier 18a of the integrating circuit 18.

The first sample-and-hold circuit SHR includes a first switch Sr and a first capacitor Cr, and when the first switch Sr is turned on, the first switch Sr connects the resistor R and the first capacitor Cr, and reduces a high-frequency noise component by a low-pass filter (LPF) including the resistor R and the first capacitor Cr to a value close to the voltage value Vout output from the integrating circuit 18 (reduces fluctuation in the voltage). When the first switch Sr is turned off, the first switch Sr is disconnected from the integrating circuit 18 and a voltage value (hereinafter, this voltage value is referred to as Vcr) is held. Further, one electrode of the first capacitor Cr is connected to a wiring between the first switch Sr and the difference circuit 19a, and the other electrode of the first capacitor Cr is connected to GND. When the first switch Sr is turned off, the first switch Sr is disconnected from the integrating circuit 18, and noise voltage at that moment is held.

Similarly, the second sample-and-hold circuit SHS includes a second switch Ss and a second capacitor Cs, and when the second switch Ss is turned on, the second switch Ss connects the resistor R and the second capacitor Cs, and reduces the high-frequency noise component by a low-pass filter (LPF) including the resistor R and the second capacitor Cs to a value close to the voltage value Vout output from the integrating circuit 18 (reduces fluctuation in the voltage). Then, when the second switch Ss is turned off, the second switch Ss is disconnected from the integrating circuit 18 and the voltage value (hereinafter, this voltage value is referred to as Vcs) is held. Further, one electrode of the second capacitor Cs is connected to a wiring between the second switch Ss and the difference circuit 19a, and the other electrode of the second capacitor Cs is connected to the GND. The LPF including the resistor R and a second capacitor Cs plays a role of reducing noise. When the second switch Ss is turned off, the second switch Ss is disconnected from the integrating circuit 18, and noise voltage at that moment is held.

Then, the first sample-and-hold circuit SHR holds, as a reference value, the voltage value Vout output from the integrating circuit 18 before the electric charges flow into the integrating circuit 18 from the radiation detection elements 7 at the time of the readout processing on the image data D, in the first capacitor Cr. Further, the second sample-and-hold circuit SHS holds, as a signal value, the voltage value Vout output from the integrating circuit 18 after the electric charges flowed from the radiation detection elements 7.

Then, the difference circuit 19a outputs difference $\Delta V$ between the voltage value Vout as the signal value held by the second sample-and-hold circuit SHS and the voltage value Vout as the reference value held by the first sample-and-hold circuit SHR. This is the image data D of an analog value mentioned above. The readout circuit 17 outputs the image data D of an analog value in this way.

Note that the A/D converter 20 is connected to an output terminal of the difference circuit 19a via the analog multiplexer 21 (see FIG. 4) as mentioned above. The analog multiplexer 21 selectively switches the outputs of the plurality of difference circuits 19a and connect one of the outputs to the A/D converter 20.

Figure 6:
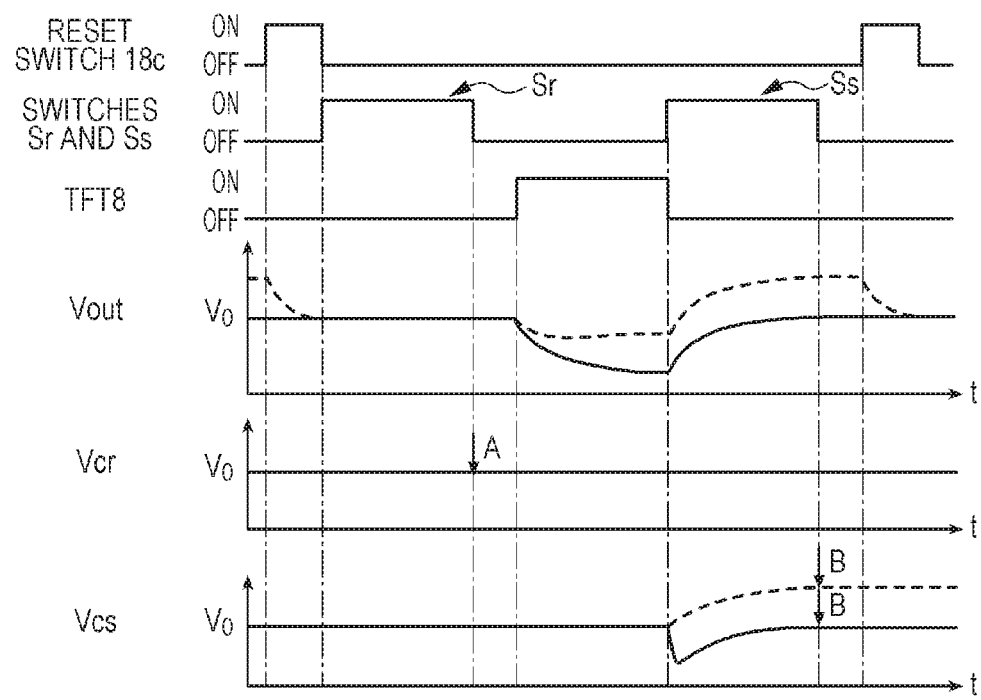

This will be more specifically described with reference to FIG. 6. Note that, in FIG. 6, a solid line indicates a case where a readout operation is performed by the readout circuit 17 in a state where no electric charge (hereinafter referred to as a signal charge in order to distinguish it from a feed through to be described later) is accumulated in the radiation detection elements 7, and a broken line indicates a case where the readout operation is performed by the readout circuit 17 in a state where signal charges are generated and accumulated in the radiation detection elements 7 as a result of irradiation of the radiation image capturing apparatus 1 with radiation.

First, the case where the readout operation is performed by the readout circuit 17 in a state where the signal charges are not accumulated in the radiation detection element 7 (see the solid line in the figure) will be described. After reset processing of the integrating circuit 18 is performed by turning on and off the reset switch 18c of the integrating circuit 18, the first switch Sr of the first sample-and-hold circuit SHR of the correlated double sampling circuit 19 is turned on to obtain a reference value.

In this case, since the voltage value Vout output from the operational amplifier 18a of the integrating circuit 18 is the reference voltage $V_0$, potential difference Vcr between both electrodes of the first capacitor Cr of the first sample-and-hold circuit SHR (hereinafter simply referred to as voltage Vcr of the first capacitor Cr) also becomes the reference voltage $V_0$.

Then, the voltage Vcr at the time point when the first switch Sr of the first sample-and-hold circuit SHR is turned off (see an arrow A in the figure) is held (sampled and held) as a reference value Vcr in the first capacitor Cr.

The TFT 8 is then turned on. In this case, however, since no signal charge is accumulated in the radiation detection elements 7, there is no signal charge flowing into the capacitor 18b of the integrating circuit 18 from the radiation detection elements 7. However, as illustrated in FIG. 6, when the TFT 8 is switched from off to on, the voltage value Vout output from the operational amplifier 18a of the integrating circuit 18 decreases. One of the main factors is a feed through.

Figure 7:
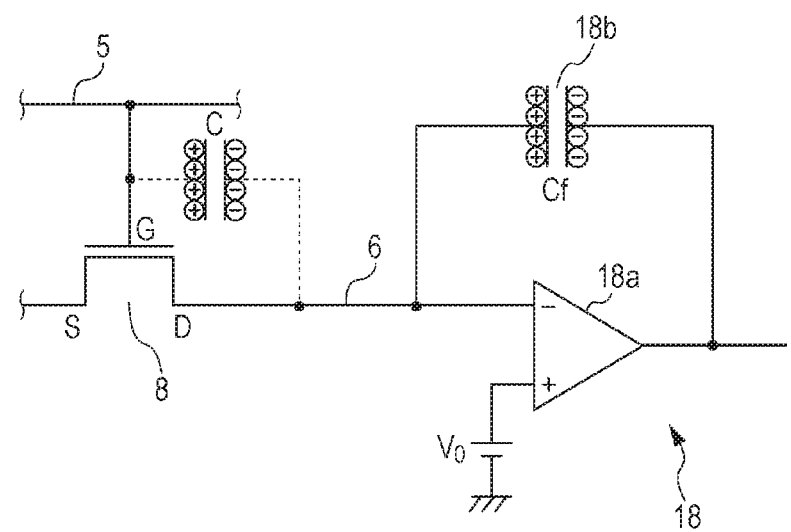

As illustrated in FIG. 7, since parasitic capacitance C exists between the scanning line 5 and the signal line 6 in the TFT 8, when the voltage applied to the scanning line 5 is switched from the off-voltage to the on-voltage, inverted and amplified voltage is output via the parasitic capacitance.

Thus, even when there is no signal charge flowing into the capacitor 18b of the integrating circuit 18 from the radiation detection elements 7 when the TFT 8 is turned on, as described above, feed throughs flow through the signal line 6 and are accumulated in the capacitor 18b of the integrating circuit 18. Therefore, as illustrated in FIG. 6, at the time point when the TFT 8 is turned on, the voltage value Vout output from the operational amplifier 18a of the integrating circuit 18 decreases to the voltage value Vout expressed by the following formula (1).

$$V_{out} = -C/C_f \times (\text{on-voltage} - \text{off-voltage}) \quad (1)$$

Note that, in the formula (1), Cf is electrostatic capacitance of the capacitor 18b of the integrating circuit 18. Further, when the TFT 8 is switched thereafter from on to off, the voltage value Vout output from the operational amplifier 18a of the integrating circuit 18 increases according to a principle similar to that described above. At that time, the voltage value Vout output from the operational amplifier 18a does not increase or decrease to a predetermined value at that moment but gradually increases or decreases as illustrated in FIG. 6. This is because of a slew rate of the integrating circuit of the readout circuit 17 or a time constant derived from an output resistance of the operational amplifier 18a and the capacitor 18b of the integrating circuit. Therefore, at the time point when the TFT 8 is turned on or turned off, the voltage value Vout output from the operational amplifier 18a of the integrating circuit 18 increases or decreases with a certain gradient or time constant.

Subsequently, when the TFT 8 is turned off, potential difference between the scanning line 5 and the signal line 6 returns to potential difference before the TFT 8 is turned on, and accordingly, a charge state of the parasitic capacitance C and a charge state of the capacitor 18b of the integrating circuit 18 return to original states (that is, states before the TFT 8 is turned on). Since the feed throughs accumulated in the capacitor 18b of the integrating circuit 18 disappear accordingly, at the time point when the TFT 8 is turned off, the voltage value Vout from the operational amplifier 18a of the integrating circuit 18, which has decreased, increases and finally returns to an original value (that is, the reference voltage $V_0$ in this case).

Then, after the TFT 8 is turned off, the second switch Ss of the second sample-and-hold circuit SHS of the correlated double sampling circuit 19 is turned on to obtain the signal value. In this case, since the voltage value Vout output from the operational amplifier 18a of the integrating circuit 18 increases as described above, potential difference Vcs between both electrodes of the second capacitor Cs of the second sample-and-hold circuit SHS (hereinafter simply referred to as voltage Vcs of the second capacitor Cs) also increases according to the voltage value Vout. Since the correlated double sampling circuit 19 has a configuration of the LPF as illustrated in in FIG. 5, the potential difference Vcs between both electrodes of the second capacitor Cs responds to the voltage value Vout with a delay due to the time constant.

Note that the timing of turning on the second switch Ss may be before turning on the first switch Sr, and it is not always necessary to adopt the above configuration. From a viewpoint of facilitating a design for reducing an offset drift of the present invention, however, it is preferable that the timing of turning on the second switch Ss is after the first switch Sr is turned off. With this configuration, a load on this sample-and-hold part of the integrating circuit output becomes common, which facilitates the design. Then, the voltage Vcs at the time point when the second switch Ss of the second sample-and-hold circuit SHS is turned off (see an arrow B in the figure) is held (sampled and held) as a signal value Vcs in the second capacitor Cs.

At that time, the voltage Vcs of the second capacitor Cs increases, and at the time point when the second switch Ss of the second sample-and-hold circuit SHS is turned off, the voltage Vcs of the second capacitor Cs is substantially returned to the reference voltage $V_0$. Therefore, both the signal value Vcs held by the second sample-and-hold circuit SHS and the reference value Vcr held by the first sample-and-hold circuit SHR are substantially the reference voltage $V_0$, and accordingly, the difference $\Delta V$ therebetween output from the difference circuit 19a becomes almost zero. Note that this result is obtained by performing the readout processing in the state where the signal charges are not accumulated in the radiation detection elements 7 as described above (that is, in this case, the image data D becomes almost zero).

On the other hand, in the case where the readout operation is performed by the readout circuit 17 in a state where capturing is performed and the radiation image capturing apparatus 1 is irradiated with radiation to generate and accumulate the signal charges in the radiation detection elements 7 (see the broken line in FIG. 6), first, when the reset switch 18c of the integrating circuit 18 is turned on, an input side and an output side of the operational amplifier 18a of the integrating circuit 18 are made conductive, and the reset processing of the integrating circuit 18 is performed. Therefore, the voltage value Vout output from the operational amplifier 18a of the integrating circuit 18 decreases to the same reference voltage $V_0$ as the input side.

Then, similarly to the above case, after the reset switch 18c of the integrating circuit 18 is turned off, the first switch Sr of the first sample-and-hold circuit SHR of the correlated double sampling circuit 19 is turned on and then turned off, and the voltage Vcr at the time point when the first switch Sr is turned off (see the arrow A in the figure) is held (sampled and held) as the reference value Vcr in the first capacitor Cr.

Subsequently, when the TFT 8 is turned on, the signal charges released from the radiation detection elements 7 flow through the signal line 6 into the capacitor 18b of the integrating circuit 18. The inflow of the signal charges works in a direction to increase the voltage value Vout output from the operational amplifier 18a of the integrating circuit 18. Meanwhile, in this case as well, the feed throughs are generated and flow into the capacitor 18b of the integrating circuit 18 to be accumulated. The generation of the feed throughs works in a direction to decrease the voltage value Vout from the operational amplifier 18a of the integrating circuit 18.

Therefore, the increase in the voltage value Vout from the operational amplifier 18a of the integrating circuit 18 due to the signal charges released from the radiation detection element 7 and the decrease in the voltage value Vout from the operational amplifier 18a of the integrating circuit 18 due to the generation of the feed throughs cancel each other. Therefore, in this case (see the broken line in FIG. 6), the fewer the signal charges accumulated in the radiation detection elements 7 (see the solid line in FIG. 6), the smaller the degree of the voltage value Vout decreasing from the reference voltage $V_0$ becomes, the voltage value Vout being output from the operational amplifier 18a of the integrating circuit 18 while the TFT 8 is turned on. In the example illustrated in FIG. 6, the voltage value Vout is slightly decreased from the reference voltage $V_0$.

When the TFT 8 is turned off, in this case as well, the feed throughs accumulated in the capacitor 18b of the integrating circuit 18 disappear. However, the signal charges flowed in from the radiation detection elements 7 remain in the capacitor 18b of the integrating circuit 18. Therefore, when the TFT 8 is turned off, although the voltage value Vout output from the operational amplifier 18a of the integrating circuit 18 increases similarly to the above case, in this case, the voltage value Vout converges to a voltage value Vout higher than the original reference voltage $V_0$ eventually.

Then, after the TFT 8 is turned off, the second switch Ss of the second sample-and-hold circuit SHS of the correlated double sampling circuit 19 is turned on/off to hold the voltage Vcs of the second capacitor Cs as the signal value Vcs. As a result, the difference ΔV output from the difference circuit 19a becomes difference ΔV (that is, image data D which is significantly different from 0) depending on the signal charges flowed into the integrating circuit 18 from the radiation detection element 7 (that is, the electric charges generated in the radiation detection elements 7 by irradiation of radiation).

Figure 5:
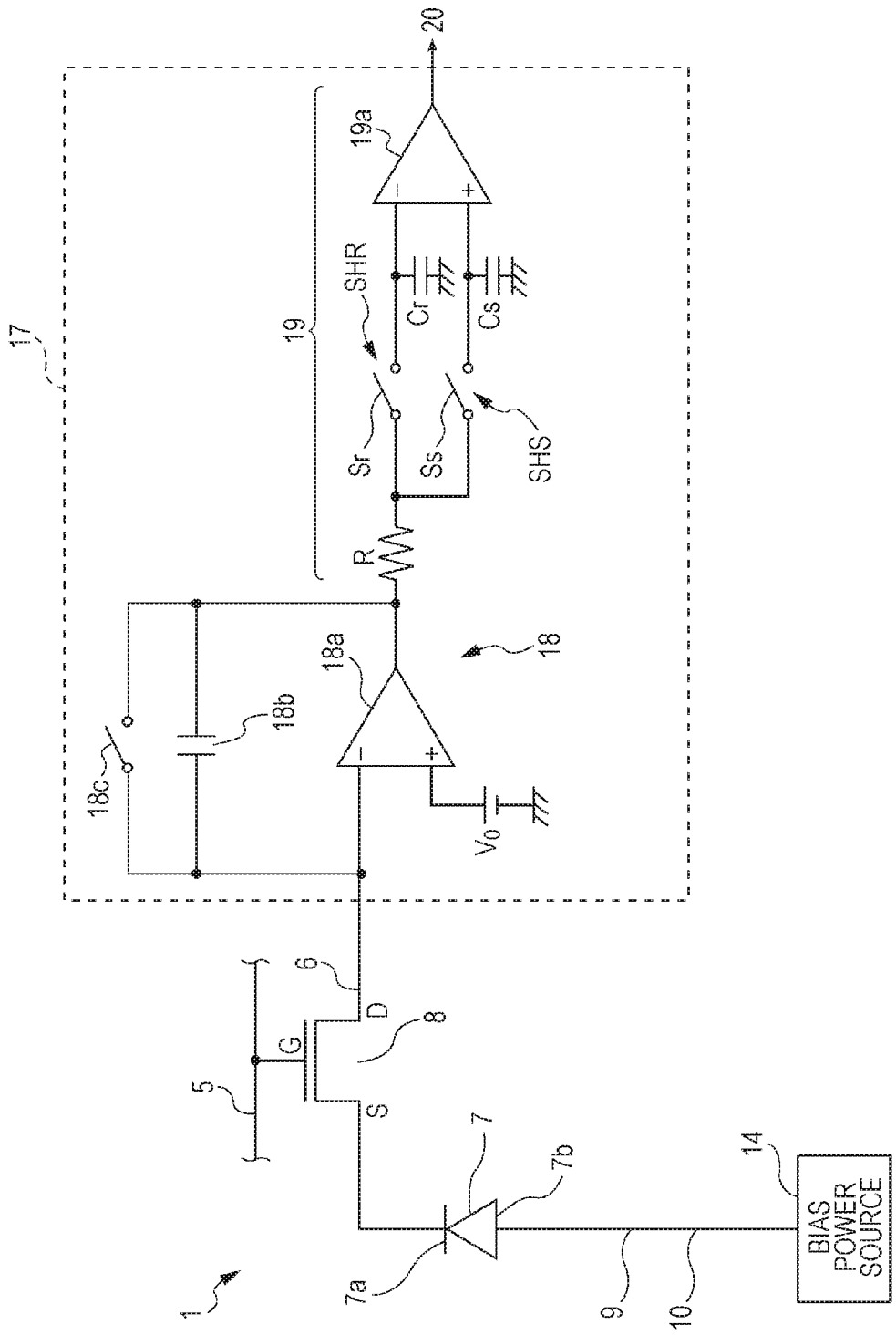
FIG. 5 is a diagram illustrating a conventional configuration example of a readout circuit.

In the readout circuit 17 of the conventional configuration example illustrated in FIG. 5, for example, the readout processing of the image data D is performed as described above. However, when a sampling time is shortened in order for operation at a high frame rate of moving image capturing, in such a conventional readout circuit 17, as mentioned above, temperature drift due to the readout IC 16 has been occurred due to temperature change of the readout IC 16 incorporating the conventional readout circuit 17.

[Knowledge on which Present Invention is Based]

As described above, since the correlated double sampling circuit 19 has the configuration of the LPF as illustrated in FIG. 5, the potential difference Vcr between both electrodes of the first capacitor Cr and the potential difference Vcs between both electrodes of the second capacitor Cs of the correlated double sampling circuit 19 of the readout circuit 17 respond to the voltage value Vout with a delay due to the time constant.

The present inventors have found through research that a cause of the temperature drift is that responsiveness of the correlated double sampling circuit 19 varies with the temperature and the sampling time is short for the responsiveness. Further, the present inventors found that another cause of the temperature drift is that responsiveness of the integrating circuit 18 including the charge amplifier circuit varies with the temperature, and following characteristics of an output signal varies with respect to an input signal.

Note that, to prevent the occurrence of the temperature drift, a method in which the sampling time is lengthen for the responsiveness of the correlated double sampling circuit 19 is considered. However, in this method, there arises a problem that a target frame rate cannot be achieved. Further, as a method for improving the responsiveness, there is a method of increasing drive current of the readout IC 16 to improve a drive capability. In such a method, however, it is necessary to provide a power source capable of supplying a large current to the radiation image capturing apparatus 1 and mechanisms for heat radiation and cooling for reducing an increase in a heating value of the readout IC 16, which causes problems such as an increase in power consumption and an increase in weight of the radiation image capturing apparatus 1.

[Mechanism of Occurrence of Temperature Drift Due to Readout IC]

Hereinafter, a mechanism of occurrence of the temperature drift due to the readout IC 16 will be described. As a result of continued research on such a mechanism of occurrence of the temperature drift due to the temperature change of the readout IC 16 incorporating the readout circuit 17, the present inventors have found that there are the following two causes of the occurrence of the temperature drift: one cause is that a time constant of the LPF changes due to change in an equivalent resistance when the transistors of the first switch Sr and the second switch Ss constituting the correlated double sampling circuit 19 are on due to the temperature change of the readout IC 16; and the other cause is that the time constant with the capacitor 18b changes due to change in an output equivalent resistance of the integrating circuit 18 due to the temperature change of the readout IC 16 Therefore, degrees of response of the voltage value Vout from the operational amplifier 18a of the integrating circuit 18, the voltage Vcr of the first capacitor Cr (that is, the reference value Vcr), and the voltage Vcs of the second capacitor Cs (that is, the signal value Vcs) change.

Further, the responsiveness of the readout IC 16 has temperature characteristics since an amplification element and the switching element (not illustrated) in the readout IC 16 have temperature dependency. According to the research of the present inventors, the slew rate and the time constant of the integrating circuit 18 and the time constant of the correlated double sampling circuit 19 become a large slew rate and small time constants in a case where the temperature of the readout IC 16 is low, and become a small slew rate and large time constants in a case where the temperature of the readout IC 16 is high.

Hereinafter, description will be made with reference to FIG. 8 and the like. Note that, in the following description, the case where the signal charges are not accumulated in the radiation detection elements 7 (the case of the solid line in FIG. 6) will be described, and the case where the signal charges generated in the radiation detection elements 7 are accumulated in the radiation detection elements 7 (the case of the broken line in FIG. 6) will be described as well in a similar manner. Therefore, the following description is not limited to the case where the signal charges are not accumulated in the radiation detection elements 7.

Figure 8:
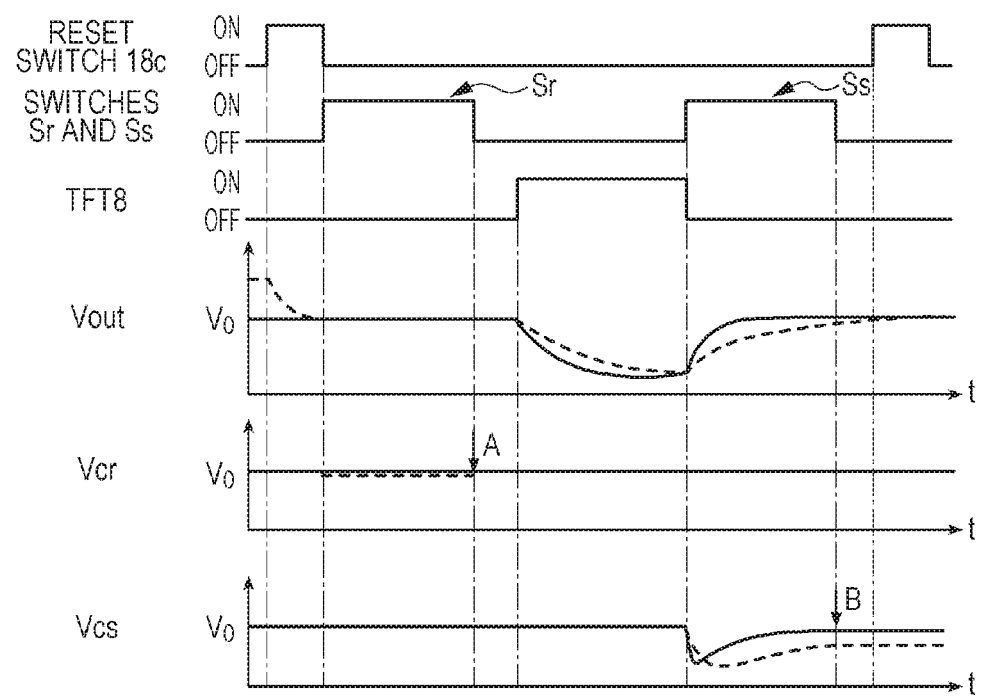

In a case where the temperature of the readout IC 16 is lower and the responsiveness of the readout IC 16 is good, as indicated by the solid line in FIG. 8, the voltage value Vout output from the operational amplifier 18a of the integrating circuit 18 relatively quickly increases from the time point when the TFT 8 is turned off. Further, the reference value Vcr of the first capacitor Cr and the signal value Vcs of the second capacitor Cs easily follow the voltage value Vout. In contrast, in a case where the temperature of the readout IC 16 is higher and the responsiveness of the readout IC 16 is poor, as indicated by the broken line in FIG. 8, the voltage value Vout output from the operational amplifier 18a of the integrating circuit 18 relatively gently increases from the time point when the TFT 8 is turned off. Further, the reference value Vcr of the first capacitor Cr and the signal value Vcs of the second capacitor Cs hardly follow the voltage value Vout.

Thus, although the voltage value Vout output from the operational amplifier 18a of the integrating circuit 18 starts to increase at the time point when the TFT 8 is turned off both in the cases where the temperature of the readout IC 16 is high and low, at a time point when the voltage Vcs of the second capacitor Cs of the second sample-and-hold circuit SHS of the correlated double sampling circuit 19 is held as the signal value Vcs (see the arrow B in the figure), the signal value Vcs held in the case where the temperature of the readout IC 16 is high and the responsiveness is poor (see the broken line) is smaller than the signal value Vcs held in the case where the temperature of the readout IC 16 is low and the responsiveness is good (see the solid line).

Moreover, as illustrated in FIG. 8, the earlier the time point when the signal value Vcs is held in the second sample-and-hold circuit SHS (see the arrow B in the figure), that is, the more the arrow B moves to the left side, the larger the difference between the signal value Vcs (solid line) in the case where the temperature of the readout IC 16 is low and the signal value Vcs (broken line) in the case where the temperature of the readout IC 16 is high becomes.

On the other hand, as illustrated in FIG. 8, since no feed through is generated as in the case where the TFT 8 is turned on at the time point when the reset processing of the integrating circuit 18 is performed by turning on/off the reset switch 18c of the integrating circuit 18 of the readout circuit 17, the voltage value Vout output from the operational amplifier 18a of the integrating circuit 18 hardly changes. Therefore, at the time point when the second switch Sr of the first sample-and-hold circuit SHR of the correlated double sampling circuit 19 is turned off and the voltage Vcr of the first capacitor Cr is held as the reference value Vcr (see the arrow A in the figure), there is almost no difference in the held reference value Vcr between the case where the temperature of the readout IC 16 is low and the responsiveness if good (see the solid line) and the case where the temperature of the readout IC 16 is high and the responsiveness is poor (see the broken line).

Therefore, the difference ΔV output as the image data D of an analog value from the difference circuit 19a (that is, the difference Vcs−Vcr between the signal value Vcs and the reference value Vcr) will be different by the difference between the signal values Vcs in the cases where the temperature of the readout IC 16 at the time point when the second switch Ss of the second sample-and-hold circuit SHS of the correlated double sampling circuit 19 is turned off and the signal value Vcs is held (see the arrow B in the figure) is low (see the solid line) and high (see the broken line). As a result, the temperature drift due to the readout IC 16 occurs.

Figure 9A:
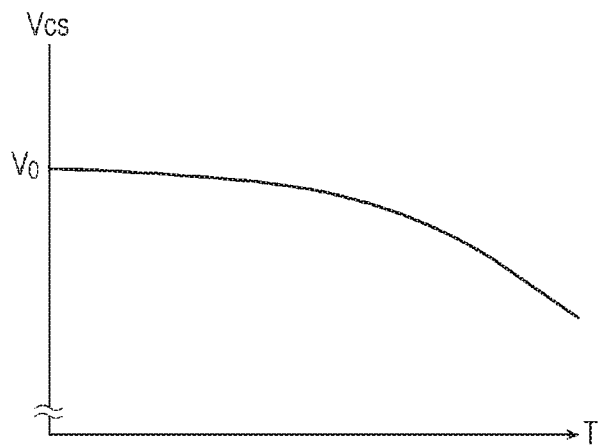
FIGS. 9A to 9C are graphs illustrating dependency of the signal value (FIG. 9A), the reference value (FIG. 9B), and difference (FIG. 9C) on the temperature of the readout IC in the configuration example of FIG. 5.
Figure 9B:
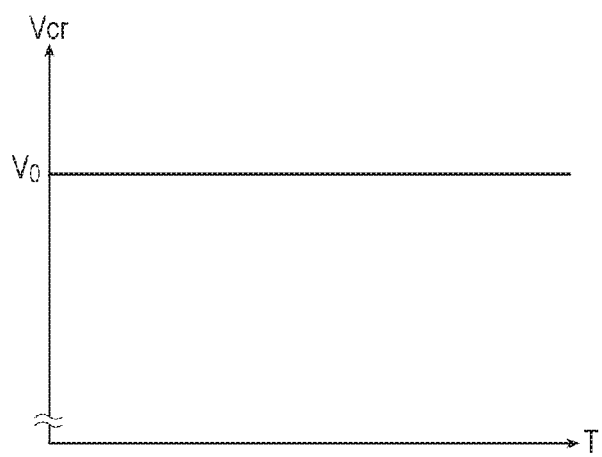

When viewed from another angle, for example, when a relationship between a temperature T of the readout IC 16 and the signal value Vcs held at the time point when the signal value Vcs is held (see the arrow B in FIG. 8) is shown in a graph where abscissa denotes the temperature T, as illustrated in FIG. 9A, for example, as the temperature T of the readout IC 16 increases, the value of the signal value Vcs decreases. In contrast, when a relationship between the temperature T of the readout IC 16 and the reference value Vcr held at the time point when the reference value Vcr is held (see the arrow A in FIG. 8) is shown in a graph where abscissa denotes the temperature T, as illustrated in FIG. 9B, for example, the reference value Vcr hardly depends on the temperature T of the readout IC 16.

Figure 9C:
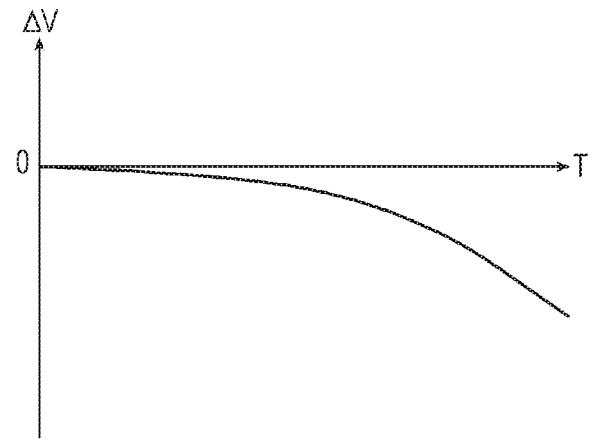

Therefore, when the difference ΔV is obtained in the difference circuit 19a, as illustrated in FIG. 9C, the difference ΔV (that is, the image data D of an analog value) decreases as the temperature T of the readout IC 16 increases. This is considered to be the mechanism of the occurrence of the temperature drift due to the readout IC 16 in the conventional case.

Note that, in the above description, the case where the signal charges are not accumulated in the radiation detection elements 7 has been described as mentioned above. However, in the case where the radiation image capturing apparatus 1 is irradiated with radiation and the signal charges are generated in the radiation detection elements 7, the signal value Vcs correspondingly increases as illustrated in FIG. 6. Accordingly, in that case, the graphs of FIGS. 9A and 9C will be into a state of being translated upward as a whole. Note that, since the reference value Vcr is held before the TFT 8 is turned on, the reference value Vcr hardly changes from the state illustrated in FIG. 9B regardless of presence or absence of the signal charges.

[Configuration and the Like of Readout Circuit According to Present Embodiment]

Next, the configuration and the like of the readout circuit 17 in the radiation image capturing apparatus 1 according to the present embodiment will be described. Also in the present embodiment, the readout circuit 17 includes the integrating circuit 18 including the operational amplifier 18a and the reset switch 18c, and the correlated double sampling circuit 19 including the first sample-and-hold circuit SHR that holds the reference value Vcr, the second sample-and-hold circuit SHS that holds the signal value Vcs, and the difference circuit 19a.

Further, in the present embodiment, there is provided a mechanism that changes the voltage value Vout output from the integrating circuit 18 during a period from when the reset switch 18c of the readout circuit 17 is turned off and the reset processing of the integrating circuit 18 is completed until when the first sample-and-hold circuit SHR holds the reference value Vcr (that is, the reference value Vcr in the first sample-and-hold circuit SHR) (hereinafter referred to as a mechanism for changing the reference value Vcr).

At that time, it is preferable that the mechanism for changing the reference value Vcr is configured such that the voltage value Vout output from the integrating circuit 18 during the period from when the reset switch 18c of the readout circuit 17 is turned off and the reset processing of the integrating circuit 18 is completed until when the first sample-and-hold circuit SHR holds the reference value Vcr (that is, the reference value Vcr in the first sample-and-hold circuit SHR) is changed in substantially the same manner as the change in the voltage value Vout output from the integrating circuit 18 during the period from when the TFT 8 serving as the switching element is turned off until when the second sample-and-hold circuit SHS holds the signal value Vcs.

Figure 13A:
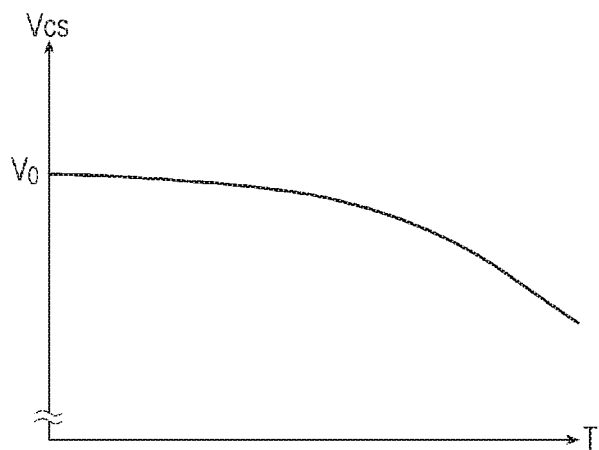
FIGS. 13A to 13C are graphs illustrating dependency of the signal value (FIG. 9A), the reference value (FIG. 9B), and the difference (FIG. 9C) on the temperature of the readout IC in Configuration Example 1 of FIG. 10.
Figure 13B:
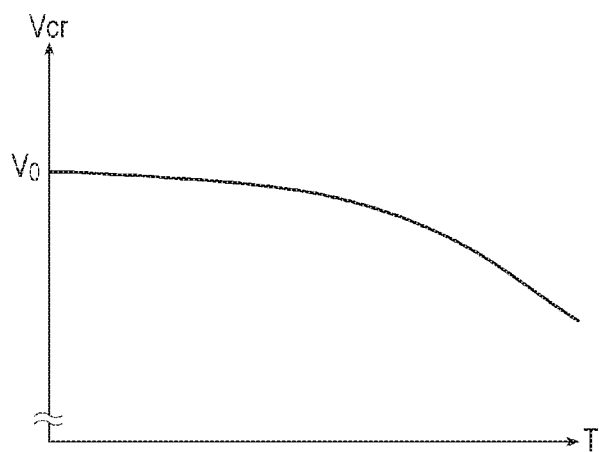
Figure 13C:

Note that, in this case, "substantially the same" means that in addition to a case where difference ΔV to be described later is completely 0, independent of the temperature T of the readout IC 16, as illustrated in FIG. 13C and the like to be described later, a case where the difference ΔV does not substantially depend on the temperature T of the readout IC 16 (that is, a case where the difference ΔV slightly deviates from 0 as the temperature T changes) is included.

Further, in the present embodiment, such a configuration forms a state where the reference value Vcr, which hardly depends on the temperature T of the readout IC 16 conventionally as described above (see FIG. 9B), decreases as the temperature T of the readout IC 16 increases as illustrated in FIG. 13B and the like to be described later.

Further, in the present embodiment, by forming such a state, as illustrated in FIG. 13C and the like to be described later, the difference ΔV between the signal value Vcs which decreases as the temperature T of the readout IC 16 increases and is output from the difference circuit 19a (see FIG. 13A to be described later) and the above-mentioned reference value Vcr is hardly depends on the temperature T of the readout IC 16.

In the present embodiment, in this way, the temperature drift due to the readout IC 16 is prevented (suppression of the temperature drift), or even when the temperature drift occurs, the extent of the temperature drift is reduced (reduction of the temperature drift).

[Specific Configuration and the Like of Mechanism for Changing Reference Value Vcr]

Hereinafter, a specific configuration example of the mechanism for changing the reference value Vcr will be described. Although two configuration examples will be described below, other configurations can be employed as long as the above-described state can be formed.

Configuration Example 1

Figure 10:
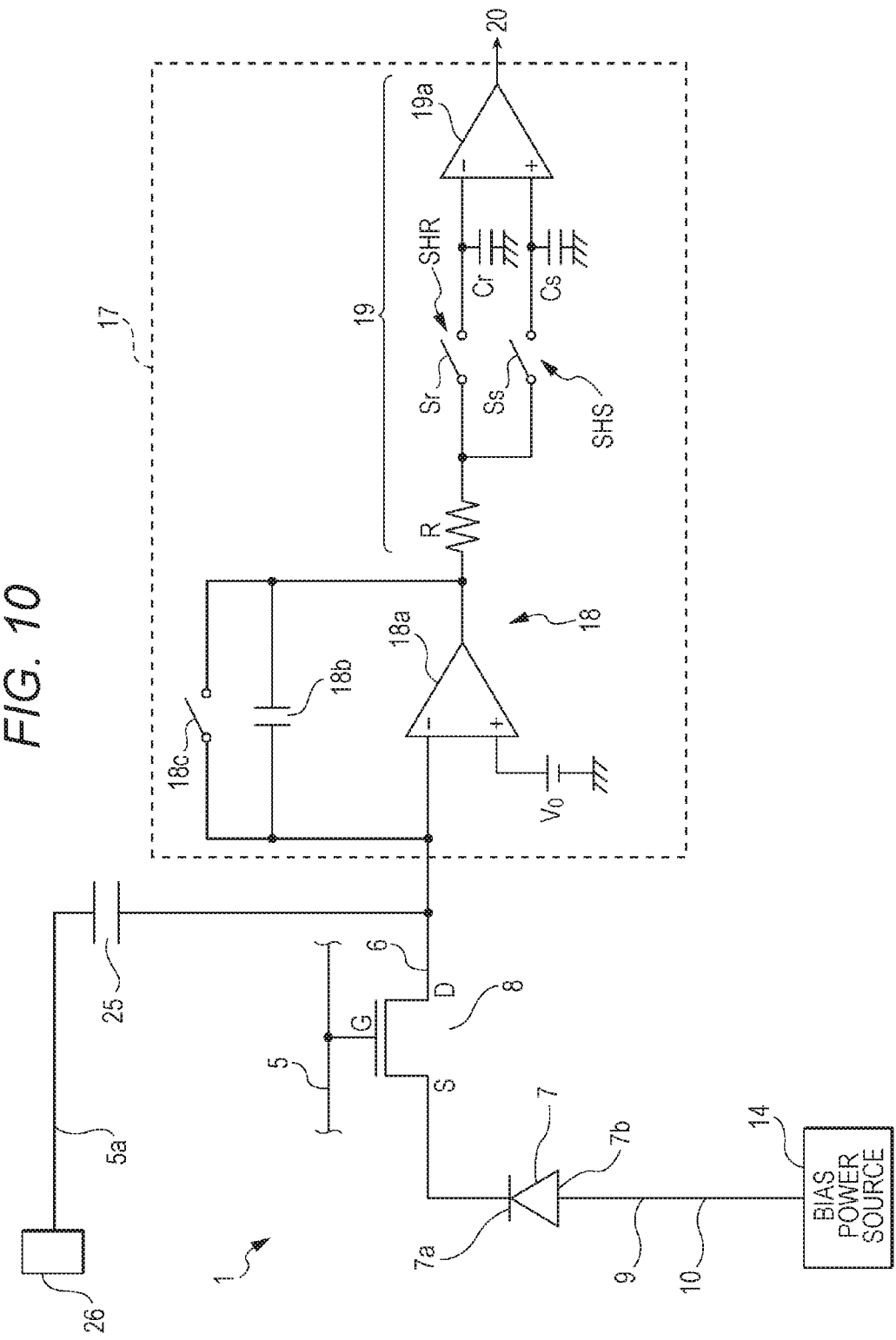
FIG. 10 is a diagram illustrating Configuration Example 1 of the readout circuit of the radiation image capturing apparatus according to an embodiment of the present invention.

For example, as Configuration Example 1 of the mechanism for changing the reference value Vcr, the mechanism can be configured as illustrated in FIG. 10. That is, in this case, the mechanism for changing the reference value Vcr includes, in addition to the configuration illustrated in FIG. 5 similar to the conventional configuration, a capacity 25 having one terminal connected to the signal line 6 and the other terminal connected to a switch 26, and the switch 26 capable of switching the capacity 25 between on and off. Note that the state where the capacity 25 is turned on is a state where on-voltage is applied to the capacity 25 and the state where the capacity 25 is turned off is a state where off-voltage is applied to the capacity 25. Further, the capacity 25 can be formed by a capacitor, for example.

Figure 11:
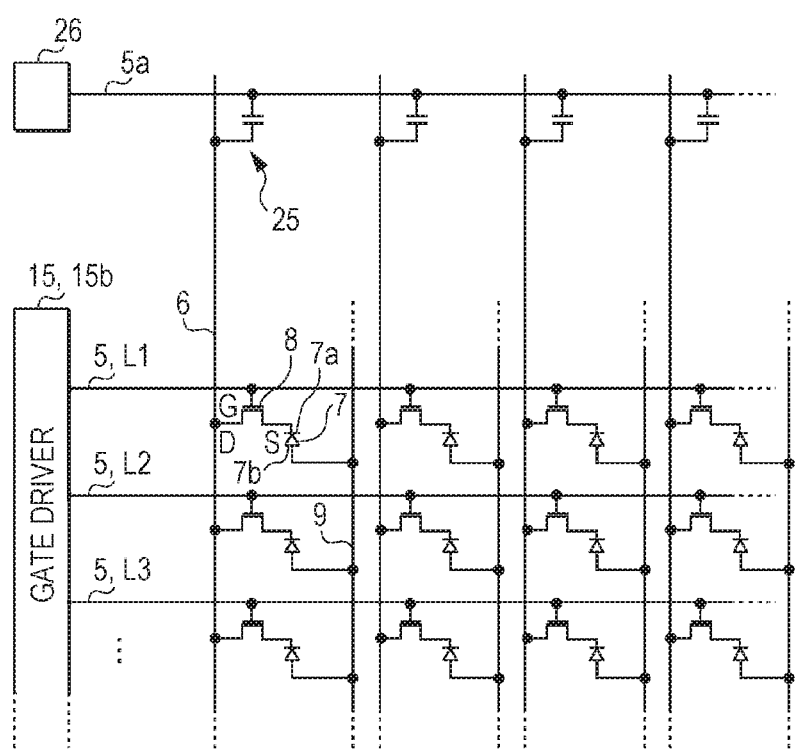
FIG. 11 is a diagram illustrating an example in a case where a capacity and a switch are formed at an end of each signal line on a substrate.

The capacity 25 and the switch 26 can be formed at an end of each signal line 6 on the sensor substrate 4 (see FIG. 2 and the like) as illustrated in FIG. 11, for example. Besides this, for example, the capacity 25 and the switch 26 can be formed on the flexible circuit board 12 (see FIG. 3), on the readout IC 16, or the like, and locations where the capacity 25 and the like are formed in the radiation image capturing apparatus 1 are not limited to specific locations.

Further, FIGS. 10 and 11 illustrate cases where the capacity 25 includes a capacity value substantially equal to that of the parasitic capacitance C occurring between the scanning line 5 and the signal line 6 at the TFT 8 serving as the switching element of each radiation detection element 7, and the on-voltage or the off-voltage which is the same voltage as the on-voltage or the off-voltage applied from the gate driver 15b to the TFT 8 is applied to the one terminal of the capacity 25 from the switch 26 via the scanning line 5a to turn on or off the capacity 25. However, the present embodiment is not necessarily limited to this configuration, as long as the following phenomenon (a phenomenon illustrated in FIG. 12 to be described later) occurs. For example, one or both of the capacity 25 and the switch 26 may be formed not only on the upper surface of the sensor substrate 4, but also on the readout IC 16 similarly to the radiation detection element 7 and the TFT 8 mentioned above.

Further, as the feed through of the same level, a product of the capacity and the voltage to be changed may be substantially the same, or a product of the capacity and the voltage to be changed may be increased or decreased in consideration of an application timing of the signal change.

Further, in Configuration Example 1, the reference value Vcr in the first sample-and-hold circuit SHR of the correlated double sampling circuit 19 of the readout circuit 17 is changed by use of such a configuration. At that time, in Configuration Example 1, using the above configuration, the reference value Vcr in the first sample-and-hold circuit SHR of the correlated double sampling circuit 19 of the readout circuit 17 is changed in substantially the same manner as the change in the voltage value Vout output from the integrating circuit 18 during a period from when the TFT 8 is turned off until when the second sample-and-hold circuit SHS holds the signal value Vcs (that is, a change in the signal value Vcs in the first sample-and-hold circuit SHS).

Figure 12:
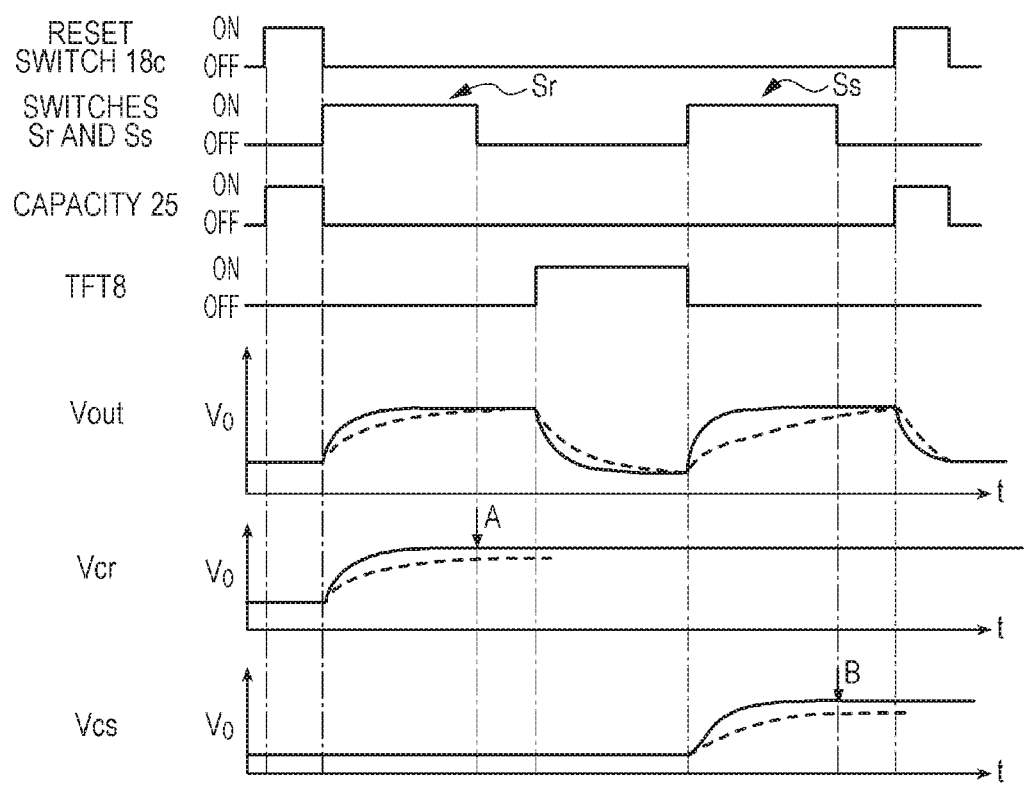

Specifically, in Configuration Example 1, as illustrated in FIG. 12, simultaneously with or after turning on the reset switch 18c of the readout circuit 17, the on-voltage is applied to the one terminal of the capacity 25 by the switch 26 to turn on the capacity 25. Then, simultaneously with or after turning off the reset switch 18c, the off-voltage is applied to the one terminal of the capacity 25 by the switch 26 to turn off the capacity 25. Further, at the same time, the switch Sr of the first sample-and-hold circuit SHR of the correlated double sampling circuit 19 of the readout circuit 17 is controlled to be turned on.

By performing the control in this way, while the reset switch 18c of the integrating circuit 18 is being turned on, electric charges are supplied from the operational amplifier 18a of the integrating circuit 18 to the other terminal of the capacity 25 even when the switch 26 applies the on-voltage to the one terminal of the capacity 25, and therefore, the voltage value Vout output from the operational amplifier 18a of the integrating circuit 18 does not change (that is, remains the reference voltage $V_o$). That is, while the reset switch 18c of the integrating circuit 18 is turned on and the on-voltage is applied to the capacity 25, electric charges are accumulated between both electrodes of the capacity 25, but not accumulated in the capacitor 18b of the integrating circuit 18 (see FIG. 10).

Next, as illustrated in FIG. 12, when the reset switch 18c of the integrating circuit 18 is turned off and the off-voltage is applied to the one terminal of the capacity 25 at the same time, the electric charges accumulated in the capacity 25 flow into the capacitor 18b of the integrating circuit 18 to be accumulated, and accordingly, the voltage value Vout output from the operational amplifier 18a of the integrating circuit 18 increases.

Note that, in this Configuration Example 1, instead of turning off the reset switch 18c of the integrating circuit 18 and turning off the capacity 25 at the same time as described above, the capacity 25 may be turned off after the reset switch 18c of the integrating circuit 18 is turned off. In this case, during a period from when the reset switch 18c of the integrating circuit 18 is turned off until when the capacity 25 is turned off, a state where the reset switch 18c of the integrating circuit 18 is turned off and the capacity 25 is turned on is formed, the state being the same as the state illustrated in FIG. 7. Therefore, though not illustrated, since the feed throughs flow from the capacity 25 to the integrating circuit 18 in this case, the voltage value Vout output from the operational amplifier 18a of the integrating circuit 18 temporarily decreases at the time point when the reset switch 18c of the integrating circuit 18 is turned off. Thereafter, at the time point when the capacity 25 is turned off, the voltage value Vout starts to increase.

As described above, in Configuration Example 1, by turning off the capacity 25 simultaneously with or after turning off the reset switch 18c of the readout circuit 17, the voltage value Vout output from the integrating circuit 18 is changed during the period until when the first sample-and-hold circuit SHR of the correlated double sampling circuit 19 holds the reference value Vcr (see the arrow A in the figure).

That is, in the conventional case, the voltage value Vout (that is, the reference value Vcr) output from the integrating circuit 18 during the period until when the correlated double sampling circuit 19 holds the reference value Vcr hardly changes (see FIG. 8), while in Configuration Example 1, by turning on/off the capacity 25 connected to the signal line 6, the voltage value Vout output from the integrating circuit 18 is intentionally changed as illustrated in FIG. 12.

With this configuration, when the voltage value Vout output from the operational amplifier 18a of the integrating circuit 18 increases to a constant value as illustrated in FIG. 12, the time constant differs between the case where the temperature of the readout IC 16 is low and the case where the temperature of the readout IC 16 is high, as mentioned above. Thus, while in the case where the temperature of the readout IC 16 is lower (the case where the responsiveness is good), as indicated by the solid line in FIG. 12, the voltage value Vout (that is, the reference value Vcr) output from the integrating circuit 18 increases comparatively rapidly from when the capacity 25 is turned off, in the case where the temperature of the readout IC 16 is higher (the case where the responsiveness is poor), as indicated by the broken line in FIG. 12, the voltage value Vout (that is, the reference value Vcr) output from the integrating circuit 18 increases relatively gently.

Therefore, by configuring as in Configuration Example 1, it is possible to change the voltage value Vout (that is, the reference value Vcr) output from the integrating circuit 18 during the period from when the capacity 25 is turned off until when the first sample-and-hold circuit SHR holds the reference value Vcr. Further, it is possible to change the voltage value Vout (that is, the reference value Vcr) output from the integrating circuit 18 during the period from when the capacity 25 is turned off until when the first sample-and-hold circuit SHR holds the reference value Vcr in substantially the same manner as the change in the voltage value Vout (that is, the signal value Vcs) output from the integrating circuit 18 during the period from when the TFT 8 is turned off until when the second sample-and-hold circuit SHS holds the signal value Vcs.

Therefore, as illustrated in FIG. 12, also in Configuration Example 1, as in the conventional case, at the time point when the voltage Vcs of the second capacitor Cs of the second sample-and-hold circuit SHS of the correlated double sampling circuit 19 is held as the signal value Vcs (see the arrow B in the figure), the signal value Vcs held in the case where the temperature of the readout IC 16 is high (the case where the responsiveness is poor, see the broken line) is smaller than the signal value Vcs held in the case where the temperature of the readout IC 16 is low (the case where the responsiveness is good, see the solid line).

However, unlike the conventional case, even at the time point when the voltage Vcr of the first capacitor Cr of the first sample-and-hold circuit SHR of the correlated double sampling circuit 19 is held as the reference value Vcr (see the arrow A in the figure), the reference value Vcr held in the case where the temperature of the readout IC 16 is high (the case where the responsiveness is poor, see the broken line) is smaller than the reference value Vcr held in the case where the temperature of the readout IC 16 is low (the case where the responsiveness is good, see the solid line).

Further, in a case where this is viewed as a relationship between the signal value Vcs or the reference value Vcr and the temperature T of the readout IC 16, as illustrated in FIGS. 9A to 9C, for example, as illustrated in FIG. 13A, the signal value Vcs decreases as the temperature T of the readout IC 16 increases, similarly to the case illustrated in FIG. 9A. In Configuration Example 1, as illustrated in FIG. 13B, the reference value Vcr also decreases as the temperature T of the readout IC 16 increases.

Therefore, in Configuration Example 1, when the difference ΔV is obtained in the difference circuit 19a, as illustrated in FIG. 13C, the difference ΔV (that is, the image data D of an analog value) is constant independent of the temperature T of the readout IC 16. Even when the difference ΔV changes depending on the temperature T of the readout IC 16, the amount of change is small. Therefore, by configuring as in Configuration Example 1, the temperature drift due to the readout IC 16 can be suppressed, or even when the temperature drift occurs, the degree of the temperature drift can be reduced.

Note that, in the above Configuration Example 1, the controller 22 of the radiation image capturing apparatus 1 can control the switch 26 that switches the reset switch 18c of the integrating circuit 18 and the voltage to be applied to the first switch Sr and the second switch Ss of the correlated double sampling circuit 19 and the one terminal of the capacity 25. It is also possible to adopt a configuration in which the above switching control is performed by a controller different from the controller 22.

Further, FIG. 12 illustrates the case where the reset switch 18c of the integrating circuit 18 of the readout circuit 17 is turned on and the on-voltage is applied to the one electrode of the capacity 25 to turn on the capacity 25 at the same timing. However, the timing at which the capacity 25 is turned on may be at the same timing at which the reset switch 18c of the integrating circuit 18 is tuned on, or after the timing at which the second switch Ss of the second sample-and-hold circuit SHS is turned off. Although the above-mentioned configuration cannot be applied before the second switch Ss of the second sample-and-hold circuit SHS is tuned off since the signal value Vcs changes, the configuration can be applied without any problem after that.

Further, FIG. 12 illustrates the case where the timing at which the capacity 25 is turned off and the timing at which the first switch Sr of the correlated double sampling circuit 19 is tuned on are the same as the timing at which the reset switch 18c of the integrating circuit 18 is turned off. However, the present embodiment is not limited to this. Further, even when the above configuration is applied, it is possible to obtain an effect exactly the same as that of the above Configuration Example 1.

Configuration Example 2

Figure 14:
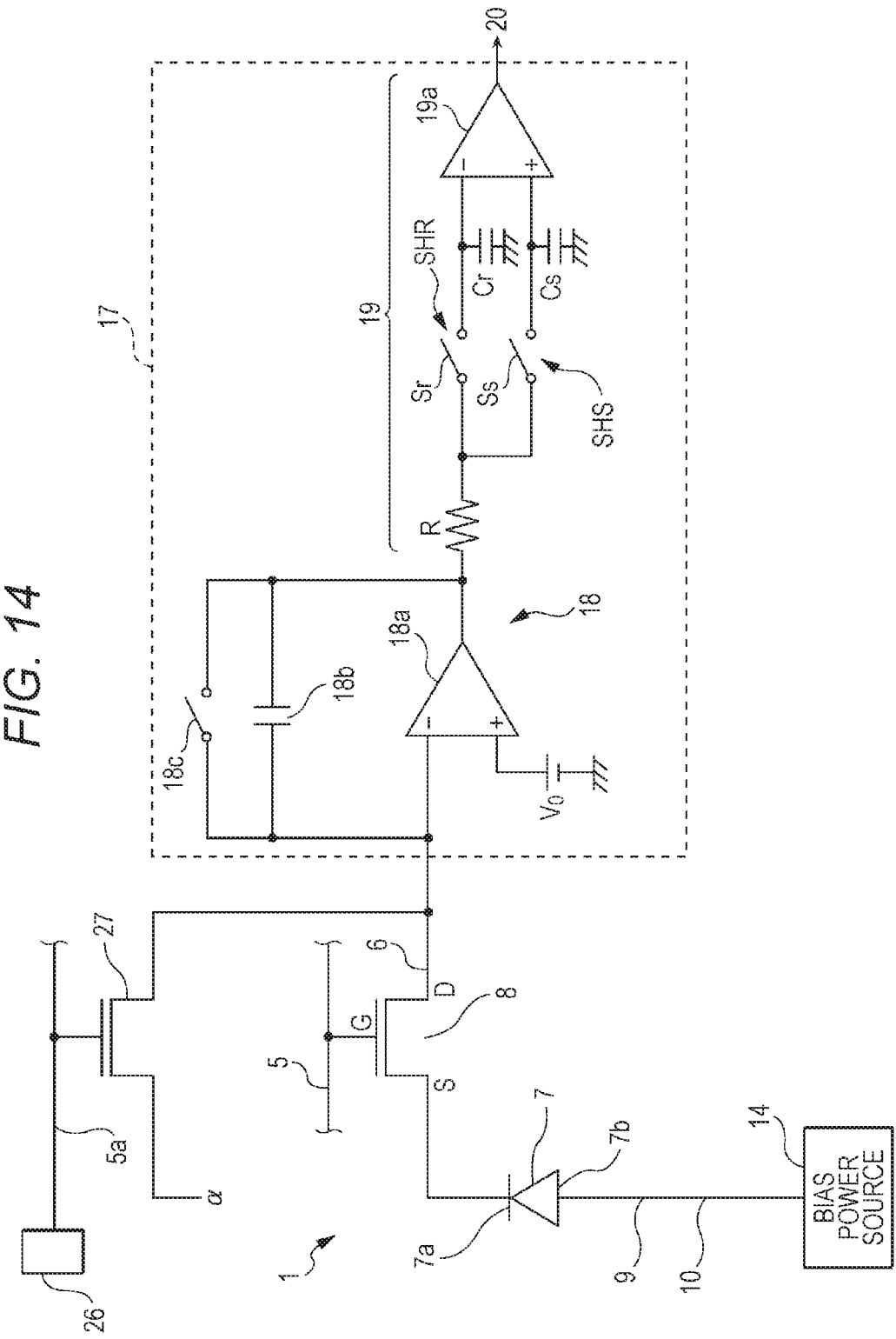
FIG. 14 is a diagram illustrating Configuration Example 2 of the readout circuit of the radiation image capturing apparatus according to an embodiment of the present invention.

Further, as illustrated in FIG. 14, a pseudo switching element 27 may be provided instead of the capacity 25 in the above Configuration Example 1. With such a configuration, since a parasitic capacitance is generated in the pseudo switching element 27, the pseudo switching element 27 acts in the same manner as the capacity 25 in Configuration Example 1.

Also in this case, the pseudo switching element 27 is switched between on and off by application of the on-voltage or the off-voltage from the switch 26 to the pseudo switching element 27, and by controlling on/off of the pseudo switching element 27 in the same manner as the on/off control of the capacity 25 described with reference to FIG. 12, it is possible to obtain an effect exactly the same as that of the case of Configuration Example 1 (see FIGS. 13A to 13C).

Note that an end of the pseudo switching element 27 on a side opposite to an end connected to the signal line 6 (see a in FIG. 14) may be an open end (that is, an end in a state where nothing is connected to the end), or may be connected to a capacitor or the like.

Configuration Example 3

Further, in the above Configuration Examples 1 and 2, the case where the capacity 25, the switch 26, the pseudo switching element 27, and the like are additionally provided has been described. However, without requiring such new configurations, the existing configurations of the radiation image capturing apparatus 1 illustrated in FIGS. 4 and 5 are used to make the existing configuration function as in the above Configuration Examples 1 and 2.

That is, in Configuration Example 3, the voltage value Vout output from the operational amplifier 18a of the integrating circuit 18 is changed as illustrated in FIG. 12 and the like when the reference value Vcr is sampled and held by use of, instead of the capacity 25, the pseudo switching element 27, and the like in Configuration Examples 1 and 2, the scan driver 15 (see FIG. 4), the scanning line 5, the TFT 8 serving as the switching element of the radiation detection element 7, and the like which are existing configurations in the radiation image capturing apparatus 1.

Here, before describing Configuration Example 3, a configuration and the like of the gate driver 15b of the scan driver 15 will be described. In the present embodiment, as mentioned above, the gate driver 15b (see FIG. 4) of the scan driver 15 switches, by switching the voltage applied to each of lines L1 to Lx of the scanning lines 5 between the on-voltage and the off-voltage, the state of the TFT 8 serving as the switching element of the radiation detection element 7 connected to each scanning line 5 is switched between on and off.

Specifically, in the present embodiment, the gate driver 15b switches the terminals to which the on-voltage is applied according to a clock pulse. Further, since each of the lines L1 to Lx of the scanning lines 5 are connected to each terminal, the gate driver 15b sequentially switches the lines L1 to Lx of the scanning lines 5 to which the on-voltage is applied according to the clock pulse. Note that this clock pulse will be referred to as a clock pulse vertical (CPV) in the sense that the scanning line 5 to which the on-voltage is applied is shifted in a vertical direction.

In the conventional case, as illustrated in FIG. 8 and the like, the scanning line 5 to which the on-voltage is applied according to the CPV is switched to the line Ln, and the on-voltage is applied from the gate driver 15b to the line Ln of the scanning lines 5 to turn on the TFT 8 of the radiation detection element 7 connected to the line Ln. Then, the electric charges are released from the radiation detection elements 7 to the readout circuit 17 such that the readout processing of the image data D is performed. Then, when the next CPV comes, the gate driver 15b switches the scanning lines 5 to which the on-voltage is applied to the next line Ln+1. Then, by repeating the above processing while sequentially switching the scanning lines 5 to which the on-voltage is applied for each CPV, the image data D can be read out from each radiation detection element 7.

Figure 15:
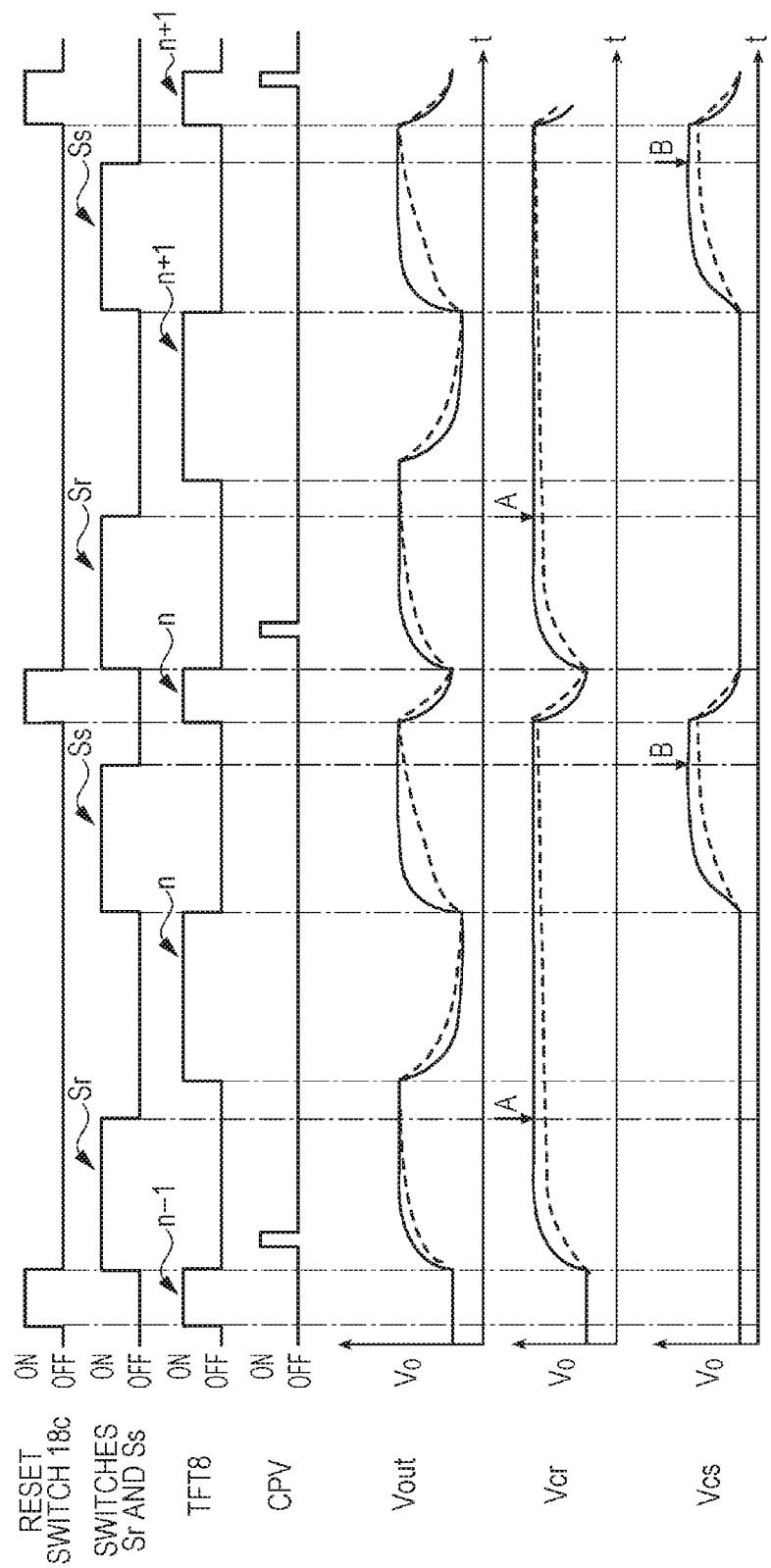

In Configuration Example 3, although the above configuration is used, as illustrated in FIG. 15, the on-voltage is applied twice, not once, per CPV from the gate driver 15b to the scanning lines 5 and the TFT 8 connected to the scanning lines 5. That is, in Configuration Example 3, in the first on-operation of the TFT 8, the electric charges are released from the radiation detection elements 7 to the readout circuit 17 such that the readout processing of the image data D is performed, and in a state where each radiation detection element 7 is empty (the state where there is no electric charge), the TFT 8 is turned on again. The second on state of the TFT 8 corresponds to turning on the capacity 25 and the pseudo switching element 27 in Configuration Examples 1 and 2.

That is, as illustrated in FIG. 15, the gate driver 15b applies the on-voltage to the line Ln of the scanning lines 5 according to the CPV, and turns on the TFT 8 of the radiation detection element 7 connected to the line Ln of the scanning lines 5 (see n on a left side of FIG. 15), such that the electric charges are released from the radiation detection elements 7 to the readout circuit 17 via the TFT 8. Then, the gate driver 15b switches the voltage to be applied to the line Ln of the scanning lines 5 to the off-voltage to turn off the TFT 8.

Then, when the second switch Ss of the correlated double sampling circuit 19 of the readout circuit 17 is turned off and the signal value Vcs is sampled and held, the gate driver 15b again switches the voltage to be applied to the same line Ln of the scanning lines 5 to the on-voltage to turn on the TFT 8. FIG. 15 illustrates an example in which the first switch Sr and the second switch Ss are turned on simultaneously with the reset switch 18c. With this operation, when the reset switch 18c of the integrating circuit 18 is turned on, the signal value Vcs and the reference value Vcr of the correlated double sampling circuit 19 are reset to the reference voltage.

Similarly to the cases of Configuration Example 1 (the capacity 25) and Configuration Example 2 (the pseudo switching element 27), the gate driver 15b switches the voltage to be applied to the line Ln of the scanning lines 5 to the off-voltage to turn off the TFT 8, simultaneously with or after turning off the reset switch 18c. Then, according to the next CPV, the gate driver 15b switches the scanning lines 5 to which the on-voltage is applied to the next line Ln+1.

With this configuration, before the image data D is read out from the radiation detection elements 7 connected to the line Ln+1 by application of the on-voltage to the next line Ln+1 of the scanning lines 5 (see n+1 in FIG. 15), the voltage value Vout output from the integrating circuit 18 during the period until when the first sample-and-hold circuit SHR holds the reference value Vcr (see the arrow A on a right side of FIG. 15) can be changed as in the cases of Configuration Examples 1 and 2.

Therefore, also in this Configuration Example 3, it is possible to obtain an effect exactly the same as that in the cases of Configuration Examples 1 and 2 (see FIGS. 13A to 13C). Further, in Configuration Example 3, without requiring a new configuration as described above, the existing configurations of the radiation image capturing apparatus 1 can be used to obtain a beneficial effect similar to that in Configuration Examples 1 and 2.

Although the case where the on-voltage is applied to one line has been described in Configuration Examples 1 to 3, it is also possible to apply the on-voltage to a plurality of lines at the same time to increase a pixel size. For example, it is also possible to select the lines Ln and Ln+1, input two CPV pulses, and then select the lines Ln+2 and Ln+3.

Configuration Example 4

Figure 16:
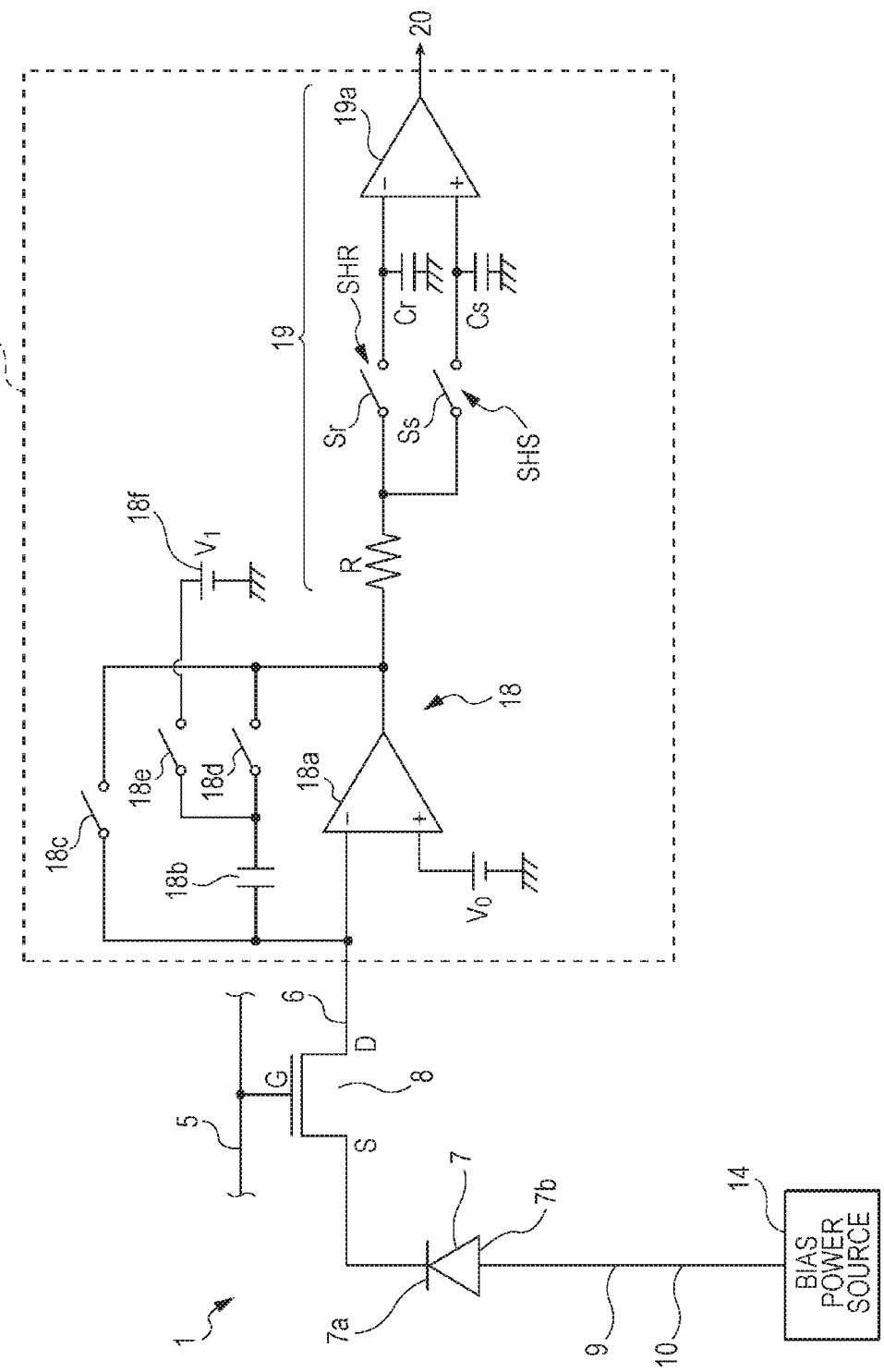
FIG. 16 is a diagram illustrating Configuration Example 4 of the readout circuit of the radiation image capturing apparatus according to an embodiment of the present invention.

Meanwhile, as Configuration Example 4 of the mechanism for changing the reference value Vcr, the mechanism can be configured as illustrated in FIG. 16, for example. That is, in this case, in the mechanism for changing the reference value Vcr, configurations of the parts such as the capacitor 18b and the reset switch 18c that are connected to the operational amplifier 18a of the integrating circuit 18 illustrated in FIG. 5 are changed.

Further, in Configuration Example 4, by application of a voltage of a predetermined voltage value $V_1$ between the input side and the output side of the operational amplifier 18a of the integrating circuit 18 at the time point when the reset switch 18c of the integrating circuit 18 of the readout circuit 17 is turned off, the voltage value Vout (that is, the reference value Vcr) output from the operational amplifier 18a of the integrating circuit 18 during the period until when the first sample-and-hold circuit SHR holds the reference value Vcr, similarly to the case of the above Configuration Example 1.

This will be described in detail below. In Configuration Example 4, as in the conventional case, the integrating circuit 18 is configured by connecting the reset switch 18c (note that, hereinafter referred to as a first reset switch 18c in order to distinguish it from a second reset switch 18d and the like to be described later) between the inverting input terminal and the output terminal of the operational amplifier 18a. Furthermore, the second reset switch 18d connected in series with the capacitor 18b is provided between the inverting input terminal and the output terminal of the operational amplifier 18a.

Further, the wiring is branched between the capacitor 18b and the second reset switch 18d, and the branched wiring is provided with a third reset switch 18e. In addition, a power source 18f that supplies voltage of the predetermined voltage value $V_1$ is connected to the third reset switch 18e.

Figure 17:
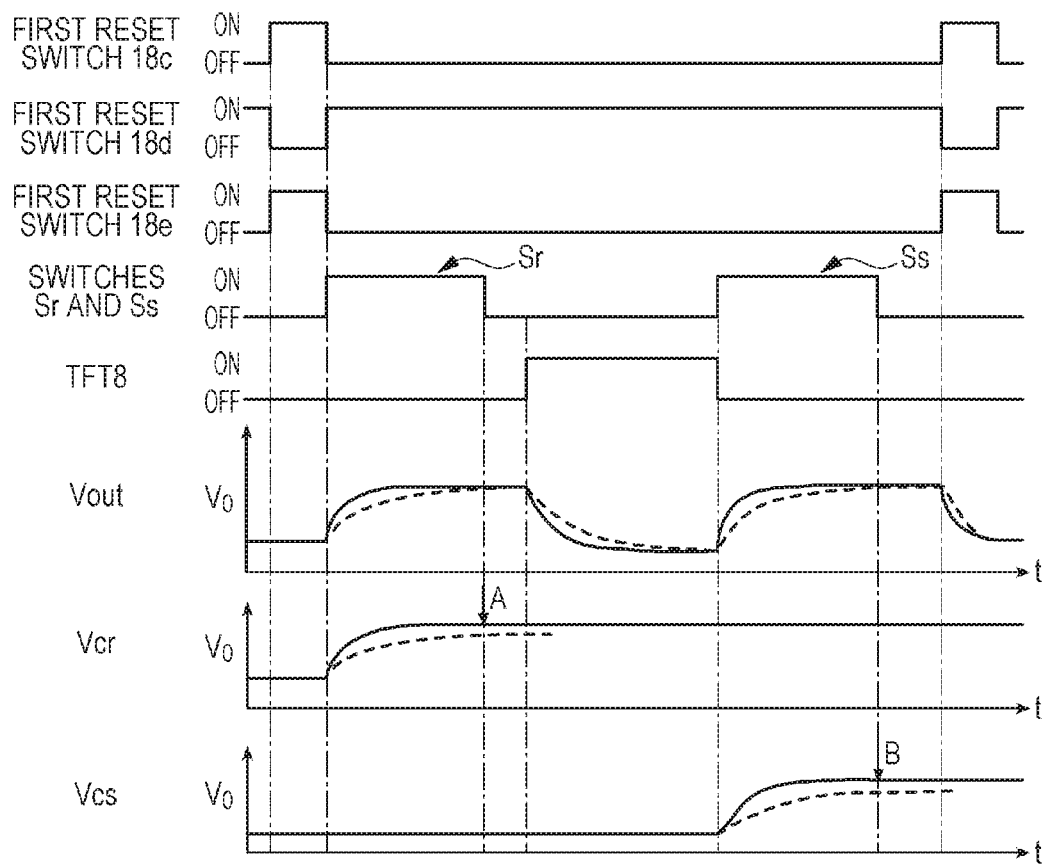

Further, as illustrated in FIG. 17, the first reset switch 18c and the third reset switch 18e are switched from on to off and switched from off to on at the same timing, and although the second reset switch 18d is switched between on and off in the same manner as the first reset switch 18c and the like, the second reset switch 18d is switched such that on and off are reversed from those of the first reset switch 18c and the like.

Specifically, in Configuration Example 4, as illustrated in FIG. 17, first, in the reset processing of the integrating circuit 18, the first reset switch 18c and the third reset switch 18e of the readout circuit 17 are turned on and the second reset switch 18d is turned off. In such a state, by turning on the first reset switch 18c, an inverting input terminal side and the output side of the operational amplifier 18a of the integrating circuit 18 are brought into conduction, and as a result, the voltage value Vout output from the operational amplifier 18a becomes $V_0$, and the reset processing of the integrating circuit 18 is performed.

The third reset switch 18e is also turned on. Therefore, since voltage of the predetermined voltage value $V_1$ is applied from the power source 18f to the electrode on the output side of the capacitor 18b and the reference voltage $V_0$ is applied to the electrode on the input side of the capacitor 18b, voltage difference of $V_1-V_0$ is generated in the capacitor 18b.

However, since the second reset switch 18d is turned off, the voltage $V_1-V_0$ is not applied to the output terminal of the operational amplifier 18a of the integrating circuit 18. Therefore, as illustrated in FIG. 17, the voltage value Vout output from the operational amplifier 18a of the integrating circuit 18 becomes the reference voltage $V_0$ (that is, the same voltage as the voltage of the non-inverting input terminal on the input side) similarly to the case of the reset processing of the normal integrating circuit 18.

Subsequently, when the reset processing of the integrating circuit 18 is completed, the first reset switch 18c and the third reset switch 18e are switched to be turned off and the second reset switch 18d is switched to be turned on. Then, voltage of $V_1-V_0$ (that is, the voltage applied to the capacitor 18b) is suddenly applied between the input side and the output side of the operational amplifier 18a of the integrating circuit 18. Therefore, the voltage value Vout output from the operational amplifier 18a of the integrating circuit 18 starts to increase toward the voltage value $V_1$ ($=V_0+(V_1-V_0)$).

As described above, in Configuration Example 1, by applying the predetermined voltage value $V_1$ to the output side of the integrating circuit 18 at the time point when the first to third reset switches 18c to 18e are switched as described above and the first reset switch 18c and the like of the readout circuit 17 are turned off, the voltage value Vout output from the integrating circuit 18 during the period until when the first sample-and-hold circuit SHR of the correlated double sampling circuit 19 holds the reference value Vcr (see the arrow A in the figure) is changed to increase from $V_0$ to $V_1$.

That is, in the conventional case, the voltage value Vout (that is, the reference value Vcr) output from the integrating circuit 18 hardly changes during the period until when the correlated double sampling circuit 19 holds the reference value Vcr (see FIG. 8), while in Configuration Example 4, by applying the voltage of the predetermined voltage value $V_1$ between the input side and the output side of the integrating circuit 18 at the time point when the first reset switch 18c and the like of the readout circuit 17 are turned off as described above, the voltage value Vout output from the integrating circuit 18 is intentionally changed as illustrated in FIG. 17.

Note that, in this case, the voltage value Vout output from the integrating circuit 18 increases to the above voltage value $V_1$. Further, as illustrated in FIG. 17, when the TFT 8 is turned on thereafter, the feed throughs are generated as in the above case, and accordingly the voltage value Vout output from the integrating circuit 18 once decreases. However, when the TFT 8 is turned off, the feed throughs disappear, and accordingly, the voltage value Vout output from the integrating circuit 18 is brought into a state of increasing from the once decreased state to the voltage value $V_1$ again.

With the above configuration, when the voltage value Vout output from the integrating circuit 18 increases to the above voltage value $V_1$ after the reset processing of the integrating circuit 18 is completed and the first reset switch 18c and the like of the readout circuit 17 are turned off, the responsiveness of the integrating circuit 18 or the responsiveness of the first sample-and-hold circuit SHR and the second sample-and-hold circuit SHS is different between the cases where the temperature of the readout IC 16 is low and high. Accordingly, difference occurs in the degree of increase in the voltage value Vout output from the integrating circuit 18.

That is, while in the case where the temperature of the readout IC 16 is lower (the case where the responsiveness is good), as indicated by the solid line in FIG. 17, the voltage value Vout (that is, the reference value Vcr) output from the integrating circuit 18 increases comparatively rapidly from the time point when the first reset switch 18c and the like are turned off, in the case where the temperature of the readout IC 16 is higher (the case where the responsiveness is poor), as indicated by the broken line in FIG. 17, the voltage value Vout (that is, the reference value Vcr) output from the integrating circuit 18 increases relatively gently.

Therefore, by configuring as in Configuration Example 4, it is possible to change the voltage value Vout (that is, the reference value Vcr) output from the integrating circuit 18 during the period from when the first reset switch 18c and the like of the integrating circuit 18 of the readout circuit 17 is turned off until when the first sample-and-hold circuit SHR holds the reference value Vcr. Further, it is possible to change the voltage value Vout (that is, the reference value Vcr) output from the integrating circuit 18 during the period from when the first reset switch 18c and the like of the integrating circuit 18 of the readout circuit 17 is turned off until when the first sample-and-hold circuit SHR holds the reference value Vcr in substantially the same manner as the change in the voltage value Vout (that is, the signal value Vcs) output from the integrating circuit 18 during the period from when the TFT 8 is turned off until when the second sample-and-hold circuit SHS holds the signal value Vcs.

Therefore, as illustrated in FIG. 17, also in Configuration Example 4, as in the conventional case, at the time point when the voltage Vcs of the second capacitor Cs of the second sample-and-hold circuit SHS of the correlated double sampling circuit 19 is held as the signal value Vcs (see the arrow B in the figure), the signal value Vcs held in the case where the temperature of the readout IC 16 is high (the case where the responsiveness is poor, see the broken line) is smaller than the signal value Vcs held in the case where the temperature of the readout IC 16 is low (the case where the responsiveness is good, see the solid line).

However, unlike the conventional case, even at the time point when the voltage Vcr of the first capacitor Cr of the first sample-and-hold circuit SHR of the correlated double sampling circuit 19 is held as the reference value Vcr (see the arrow A in the figure), the reference value Vcr held in the case where the temperature of the readout IC 16 is high (the case where the responsiveness is poor, see the broken line) is smaller than the reference value Vcr held in the case where the temperature of the readout IC 16 is low (the case where the responsiveness is good, see the solid line).

Figure 18A:
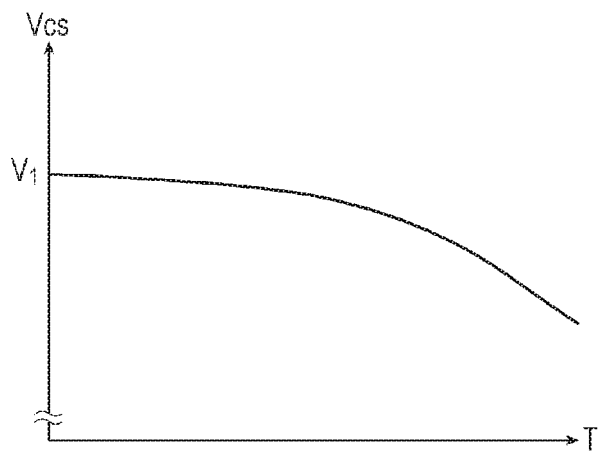
FIGS. 18A to 18C are graphs illustrating dependency of the signal value (FIG. 18A), the reference value (FIG. 18B), and difference (FIG. 18C) on the temperature of the readout IC in Configuration Example 4 of FIG. 16.
Figure 18B:
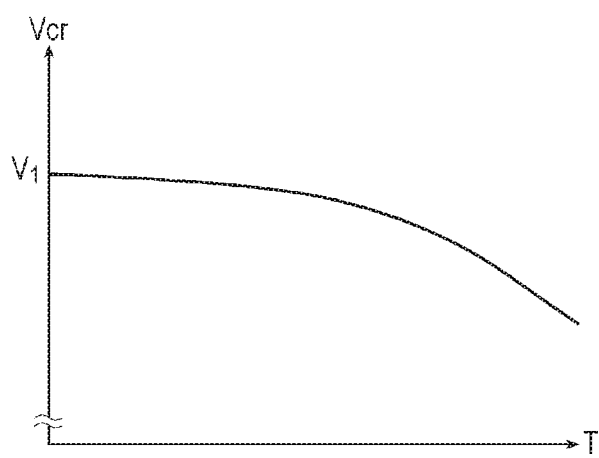

Further, in a case where this is viewed as a relationship between the signal value Vcs or the reference value Vcr and the temperature T of the readout IC 16, as illustrated in FIGS. 9A to 9C, for example, as illustrated in FIG. 18A, the signal value Vcs decreases as the temperature T of the readout IC 16 increases, similarly to the case illustrated in FIG. 9A. In Configuration Example 4, as illustrated in FIG. 18B, the reference value Vcr also decreases as the temperature T of the readout IC 16 increases.

Figure 18C:

Therefore, in Configuration Example 4, when the difference ΔV is obtained in the difference circuit 19a, as illustrated in FIG. 18C, the difference ΔV (that is, the image data D of an analog value) is constant independent of the temperature T of the readout IC 16. Even when the difference ΔV changes depending on the temperature T of the readout IC 16, the amount of change is small. Therefore, by configuring as in Configuration Example 4, the temperature drift due to the readout IC 16 can be suppressed, or even when the temperature drift occurs, the degree of the temperature drift can be reduced.

Note that, also in the above Configuration Example 4, the controller 22 of the radiation image capturing apparatus 1 can perform switching control of on/off of the first reset switch 18c, the second reset switch 18d, and the third reset switch 18e of the integrating circuit 18, and the first switch Sr and the second switch Ss of the correlated double sampling circuit 19. However, it is also possible to adopt a configuration in which the above switching control is performed by a controller different from the controller 22.

Further, the on/off timing of each switch is not limited to the above. The first reset switch 18c and the third reset switch 18e may be turned on in any order after the second reset switch 18d is turned off, or the second reset switch 18d may be turned on and the third reset switch 18e may be turned off in any order after the first reset switch 18c is turned off.

High-Speed Readout of Image Data

On the other hand, by configuring as in the above Configuration Examples 1 to 4, the temperature drift due to the readout IC 16 can be suppressed or reduced as described above, and at the same time, high-speed readout of the image data D can be realized. This point will be described below.

The high-speed readout of the image data D can be realized by, for example, shortening the period from when the first switch Sr of the first sample-and-hold circuit SHR is turned on until when it is turned off (hereinafter referred to as an on-period of the first switch Sr) illustrated in FIGS. 12 and 17, or shortening the period from when the second switch Ss of the second sample-and-hold circuit SHS is turned on until when it is turned off (hereinafter referred to as an on-period of the second switch Ss).

Hereinafter, how to determine each of the on-periods in a case where the radiation image capturing apparatus 1 is configured as in the above Configuration Examples 1 to 4 (more precisely, how to determine times t1 and t2 to be described later) will be specifically described, taking as an example the case where the radiation image capturing apparatus 1 is configured as in the above Configuration Example 4.

In the present embodiment, as illustrated in FIGS. 18A to 18C, suppression or reduction of the temperature drift due to the readout IC 16 is realized by setting the difference ΔV in the case where the temperature of the readout IC 16 is low (the image data D of an analog value, that is, the difference between the signal value Vcs held by the second sample-and-hold circuit SHS and the reference value Vcr held by the first sample-and-hold circuit SHR) and the difference ΔV in the case where the temperature of the readout IC 16 is high to the same value (or almost the same value).

Further, as illustrated in FIG. 17, the voltage value Vout output from the integrating circuit 18 increases during the period from when the reset processing of the integrating circuit 18 is completed and the first reset switch 18*c* of the integrating circuit 18 is turned off until when the voltage value Vout is held as the reference value Vcr by the first sample-and-hold circuit SHR. When this is approximated with a mathematical formula, the reference value Vcr in this case can be expressed as $$Vcr = (V_1 - V_0) \times (1 - \exp(-t1/\tau 1)) + V_0 \qquad (2)$$

Here, t1 represents a time from when the first reset switch 18*c* of the integrating circuit 18 is turned off until when the voltage value Vout is held as the reference value Vcr in the first sample-and-hold circuit SHR, and τ1 represents the time constant. A coefficient ($V_1 - V_0$) which is a first item of the right side of the formula (2) corresponds to a change in the voltage occurring at the voltage value Vout output from the integrating circuit 18 at the first sampling and holding. In the formula (2), when t1 is made infinite, Vcr converges to $V_1$.

Note that, although a time response of the reference value Vcr is strictly represented by the responsiveness of the integrating circuit 18 and an LPF time constant of the first sample-and-hold circuit SHR, it is assumed that the time response can be represented by one representative time constant τ1 in order to simplify the description. The same applies to the τ2 as follows.

On the other hand, as illustrated in FIG. 17, the voltage value Vout output from the integrating circuit 18 increases also during the period from when the TFT 8 is turned off until when the voltage value Vout is held as the signal value Vcs by the second sample-and-hold circuit SHS. When this is approximated with a mathematical formula, the signal value Vcs in this case can be expressed as $$Vcs = (V_1 - Va) \times (1 - \exp(-t2/\tau 2)) + Va \qquad (3)$$

Here, Va represents a voltage value when the voltage value Vout temporarily decreases due to the feed throughs, t2 represents the time from when the TFT 8 is turned off until when the voltage value Vout is held as the signal value Vcs in the second sample-and-hold circuit SHS, and τ2 represents the time constant. A coefficient ($V_1 - Va$) which is a first item of the right side of the formula (3) corresponds to a change in the voltage occurring at the voltage value Vout output from the integrating circuit 18 at the second sampling and holding. In the formula (3), when t2 is made infinite, Vcs converges to $V_1$.

Further, when the time constants τ1 and τ2 in the case where the temperature of the readout IC 16 is low (a predetermined temperature Tlow) is represented as τ1L and τ2L, respectively, and the difference ΔV is represented as ΔVL, the above difference ΔV (that is, ΔVL) is represented as difference between the above formulas (3) and (2). Therefore, the difference ΔV is represented by:

$$\begin{aligned}\Delta VL =\ & (V_1 - Va) \times (1 - \exp(-t2/\tau 2L) + Va - \\ & (V_1 - V_0) \times (1 - \exp(-t1/\tau 1L) - V_0 \\ =\ & V_1 - (V_1 - Va) \times \exp(-t2/\tau 2L) - \\ & V_1 + (V_1 - V_0) \times \exp(-t1/\tau 1L) \\ \therefore \Delta VL =\ & -(V_1 - Va) \times \exp(-t2/\tau 2L) + \\ & (V_1 - V_0) \times \exp(-t1/\tau 1L)\end{aligned} \qquad (4)$$

Note that the same applies to the following time constants τ1H and τ2H, and although the time constants τ1L and τ2L are theoretically determined by a resistance value of the resistor R of the correlated double sampling circuit 19, each electrostatic capacitance of the first capacitor Cr and the second capacitor Cs, and the like, the time constants τ1L and τ2L actually vary depending on the temperature T of the readout IC 16. From the above reason, the time constants τ1L and τ2L in the case where the temperature of the readout IC 16 is the predetermined temperature Tlow are experimentally obtained in advance.

Similarly in the case where the temperature of the readout IC 16 is high (a predetermined temperature Thigh), when the time constants τ1 and τ2 are represented as τ1H and τ2H, respectively, and the difference ΔV is represented as ΔVH, by performing calculation similar to the above, the above difference ΔV (that is, ΔVH) is represented by:

$$\begin{aligned}\Delta VH =\ & (V_1 - Va) \times (1 - \exp(|t2/\tau 2H) + Va - \\ & (V_1 - V_0) \times (1 - \exp(-t1/\tau 1H) - V_0 \\ \therefore \Delta VH =\ & -(V_1 - Va) \times \exp(-t2/\tau 2H) + \\ & (V_1 - V_0) \times \exp(-t1/\tau 1H)\end{aligned} \qquad (5)$$

Then, by adjusting each of the above parameters such that the differences ΔVL and ΔVH become the same value (or almost the same value), suppression or reduction of the temperature drift due to the readout IC 16 can be realized. That is, each of the parameters is adjusted such that a value of:

$$\begin{aligned}\Delta VH - \Delta VL =\ & -(V_1 - Va) \times \exp(-t2/\tau 2L) + \\ & (V_1 - V_0) \times \exp(-t1/\tau 1L) - \\ & \{-(V_1 - Va) \times \exp(-t2/\tau 2H) + \\ & (V_1 - V_0) \times \exp(-t1/\tau 1H)\} \\ =\ & -(V_1 - Va) \times \{\exp(-t2/\tau 2L) - \exp(-t2/\tau 2H)\} + \\ & (V_1 - V_0) \times \{\exp(-t1/\tau 1L) - \exp(-t1/\tau 1H)\}\end{aligned} \qquad (6)$$

$$= -\Delta VcsH\text{-}L + \Delta VcrH\text{-}L \qquad (7)$$

becomes equal to 0 (or a value close to 0).
Note that, in the above formula (7), $$\Delta VcsH\text{-}L = (V_1 - Va) \times \{\exp(-t2/\tau 2L) - \exp(-t2/\tau 2H)\}$$

$$\Delta VcrH\text{-}L = (V_1 - V_0) \times \{\exp(-t1/\tau 1L) - \exp(-t1/\tau 1H)\}.$$

Further, ΔVcsH-L in the formula (7) is voltage difference caused by temperature generated in the first sample-and-hold circuit SHR, and ΔVcrH-L in the formula (7) is voltage difference caused by temperature generated in the second sample-and-hold circuit SHS. The suppression and reduction of the temperature drift can be realized under a condition in which the values of the first and second items of the above formula (7) are equal (or approximately equal). Note that ($V_1 - Va$) and ($V_1 - V_0$) respectively correspond to changes in the voltage occurring at the voltage value Vout output from the integrating circuit 18 at the first second sampling and holding and the second sampling and holding.

Further, in the above formulas (6) and (7), the reference voltage $V_0$ cannot be changed and is a fixed value because the reference voltage $V_0$ is voltage serving as a reference of the voltage applied to each part of the radiation image capturing apparatus 1. Further, a voltage value Va when the voltage value Vout temporarily decreases due to the feed throughs is a value determined in advance according to an amount of the feed throughs based on the parasitic capacitance C between the scanning line 5 and the signal line 6 in the TFT 8 (see FIG. 7), and the like, and the voltage value Va may be obtained experimentally or may be calculated from a design value.

Further, by changing the time constant $\tau$ ($\tau 1$ and $\tau 2$, or $\tau 1L$, $\tau 2L$, $\tau 1H$, and $\tau 2H$), the above $\Delta VH - \Delta VL$ can be set to 0 (or approximated to 0). In order to change the time constant $\tau$, it is necessary to change a resistance value of the resistor R of the correlated double sampling circuit 19, each electrostatic capacitance of the first capacitor Cr and the second capacitor Cs, and the like. However, when they are changed, a state of suppression of noise changes, and in some cases, an influence of the noise may become serious. Therefore, it is desirable that the time constant $\tau$, that is, the resistance value of the resistor R of the correlated double sampling circuit 19, each electrostatic capacitance of the first capacitor Cr and the second capacitor Cs, and the like are not changed from preset values from a viewpoint of the noise and the like.

From the above consideration, the parameters that can be changed in the above formula (6) are the voltage value $V_1$ and the times t1 and t2. Further, as mentioned above, since the on-period of the first switch Sr and the on-period of the second switch Ss have to be set within a range of a period in which an image quality of the image data D does not deteriorate by remaining noise (a period in which deterioration of the image quality of the image data D due to the noise is suppressed within a predetermined range), the above times t1 and t2 has a restriction that the on-period of the first switch Sr and the on-period of the second switch Ss have to be set to be within the above range.

Although the above times t1 and t2 have such a restriction, by adjustment of the voltage value $V_1$ to an appropriate value, it is possible to set the times t1 and t2 as short as possible and set the above formulas (6) and (7) to 0 (or approximate to 0). For example, in a case where the temperature drift is suppressed by a sampling for a long time, a standard for the times t1 and t2 are five times or more the time constant. However, by application of the present invention, the temperature drift can be suppressed even when the times t1 and t2 are set to 5 times or less the time constant.

That is, by changing the voltage value $V_1$ applied from the power source 18f (see FIG. 16) to the integrating circuit 18 via the third reset switch 18e to an appropriate value, it is possible to shorten the time t1 from when the reset processing of the integrating circuit 18 is completed and the first reset switch 18c of the integrating circuit 18 is turned off until when the reference value Vcr is held by the first sample-and-hold circuit SHR, and the time t2 from when the TFT 8 is turned off until when the signal value Vcs is held by the second sample-and-hold circuit SHS.

Therefore, in the present embodiment, the high-speed readout of the image data D can be realized. In addition, as described above, suppression and reduction of the temperature drift due to the readout IC 16 can also be realized.

Note that, although the configuration in which the turning off of the TFT and the turning on of the switch Ss of the SHS are simultaneously switched has been described, the present embodiment is not limited to this configuration, and the switch Ss may be turned on simultaneously with turning on the TFT, before or after turning on the TFT, or simultaneously with or before or after turning on the switch Sr. From the viewpoint of facilitating the design, it is preferable that the switches Sr and Ss are not turned on simultaneously because a load on the sample-and-hold circuit becomes common.

[Effect]

As described above, according to the radiation image capturing apparatus 1 according to the present embodiment, the mechanism for changing the reference value Vcr is provided before performance of on/off control of the TFT 8 serving as the switching element of the radiation detection elements 7 in the readout processing of the image data D. Further, the radiation image capturing apparatus 1 is configured such that, by this mechanism, the voltage value Vout output from the integrating circuit 18 which has hardly changed before the on/off control of the TFT 8 in the conventional case is intentionally changed.

With this configuration, the reference value Vcr which has hardly changed even when the temperature T of the readout IC 16 changes in the conventional case can be made to be depend on the temperature T of the readout IC 16 similarly to the signal value Vcs (see FIGS. 13A to 13C and FIGS. 18A to 18C). Accordingly, the temperature drift due to the readout IC 16 can be suppressed or reduced.

Further, in the radiation image capturing apparatus 1 according to the present embodiment, as described above, it is possible to shorten the time t1 from when the reset processing of the integrating circuit 18 is completed and the first reset switch 18c of the integrating circuit 18 is turned off until when the reference value Vcr is held by the first sample-and-hold circuit SHR, and the time t2 from when the TFT 8 is turned off until when the signal value Vcs is held by the second sample-and-hold circuit SHS. Accordingly, the high-speed readout of the image data D (that is, reading out the image data D in a short time) can be performed.

Therefore, according to the radiation image capturing apparatus 1 according to the present embodiment, both high-speed readout of the image data and suppression or reduction of the temperature drift can be realized.

Further, in the radiation image capturing apparatus 1 according to the present embodiment, the temperature drift due to the readout IC 16 does not occur even when the temperature T of the readout IC 16 changes (or even when the temperature drift occurs, the degree of the temperature drift is suppressed to be very small), it is unnecessary to perform warm-up or the like of the readout IC 16 before start of moving image capturing, and the moving image capturing can be immediately started.

Further, since it is unnecessary to perform warm-up or the like of the readout IC 16 or to flow a large current to the readout IC 16 in order to improve the responsiveness, power consumption does not increase more than necessary. Moreover, since it is not particularly necessary to provide a cooling device or the like in the radiation image capturing apparatus 1, it is possible to precisely prevent weight of the radiation image capturing apparatus 1 from increasing by weight of the cooling device or the like.

Further, in the case where the radiation image capturing apparatus 1 is portable, in many cases, the radiation image capturing apparatus 1 is used for image capturing in a state where the radiation image capturing apparatus 1 is loaded in a cassette holder of an image capturing base which is not illustrated. However, when the radiation image capturing apparatus 1 is provided with the cooling device or the like as described above, the portable type radiation image capturing apparatus 1 becomes thick in the thickness direction (irradiation direction of radiation), for example, and the radiation image capturing apparatus 1 may be incapable of being loaded in the cassette holder of the image capturing base. However, since there is no need to provide such a cooling device or the like in the radiation image capturing apparatus 1 in the present embodiment, it is possible to precisely prevent occurrence of such a problem.

Note that, in the present embodiment, as mentioned above, the times t1 and t2 are set such that the image quality of the image data D is not deteriorated due to an influence of the noise by setting the times t1 and t2 too short and accordingly shortening the on-period of the first switch Sr and the on-period of the second switch Ss. Therefore, in the radiation image capturing apparatus 1 according to the present embodiment, it is also possible to precisely prevent degradation of the image quality due to the influence of the noise.

Further, in the above embodiments, Configuration Examples 1 to 4, and the like, the time constant of the LPF can be changed by changing the resistance value of the resistor R of the correlated double sampling circuit 19, for example. At that time, it is also possible to configure the time constant of the LPF to change from a small value to a large value, for example, during the period from when the first switch Sr of the correlated double sampling circuit 19 is tuned on until when the reference value Vcr is sampled and held (that is, during the on-period of the first switch Sr), for example.

With this configuration, in a state where the time constant of a first half of the on-period of the first switch Sr is small, the reference value Vcr increases more rapidly. Therefore, the on-period of the first switch Sr can be shortened. For example, even when the time of a latter half of the on-period of the first switch Sr is set to 3 times or less the LPF time constant set in this period, the temperature drift can be suppressed. Therefore, the high-speed readout of the image data D can be precisely realized. Further, with the above configuration, since the time constant of the LPF becomes large in the latter half of the on-period of the first switch Sr, the noise can be suppressed, and the noise of the reference value Vcr can be reduced.

Further, the above configuration can be similarly applied to the period from when the second switch Ss of the correlated double sampling circuit 19 is turned on until when the signal value Vcs is sampled and held (that is, the on-period of the second switch Ss).

Although embodiments of the present invention have been described and illustrated in detail, the disclosed embodiments are made for purposes of illustration and example only and not limitation. The scope of the present invention should be interpreted by terms of the appended claims. The present invention can be appropriately modified as long as the modification does not depart from the gist of the present invention.

What is claimed is:

1. A radiation image capturing apparatus, comprising:
a plurality of scanning lines and a plurality of signal lines;
a plurality of radiation detection elements arranged two-dimensionally;
a scan driver capable of switching a switching element of the radiation detection elements between on and off by applying an on-voltage or an off-voltage to the switching element via the scanning lines; and
a readout IC incorporating a plurality of readout circuits that reads out, as image data, electric charges flowing in from each of the radiation detection elements via each of the signal lines,
wherein the readout circuit includes:
an integrating circuit that outputs a voltage value corresponding to the electric charges flowing in from each of the radiation detection elements;
a reset switch that resets the integrating circuit;
a first sample-and-hold circuit that holds, as a reference value, the voltage value output from the integrating circuit before the electric charges flow in from each of the radiation detection elements;
a second sample-and-hold circuit that holds, as a signal value, the voltage value output from the integrating circuit after the electric charges flow in from each of the radiation detection elements; and
a difference circuit that outputs difference between the signal value held by the second sample-and-hold circuit and the reference value held by the first sample-and-hold circuit, and
the radiation image capturing apparatus further includes a mechanism that changes the voltage value output from the integrating circuit during a period from when the resetting of the integrating circuit is completed and the reset switch of the readout circuit is turned off until when the first sample-and-hold circuit holds the reference value,
wherein
the mechanism includes a capacity having one terminal connected to the signal line and the other terminal connected to a switch; and the switch capable of switching the capacity between on and off, and
by turning off the capacity simultaneously with turning off the reset switch of the readout circuit or after turning off the second sample-and-hold circuit, the mechanism changes the voltage value output from the integrating circuit during the period until when the first sample-and-hold circuit holds the reference value.

2. The radiation image capturing apparatus according to claim 1, wherein
the radiation image capturing apparatus is a portable type.

* * * * *